(12) United States Patent
Roberts et al.

(10) Patent No.: US 11,705,872 B2
(45) Date of Patent: Jul. 18, 2023

(54) BROADBAND POWER TRANSISTOR DEVICES AND AMPLIFIERS WITH OUTPUT T-MATCH AND HARMONIC TERMINATION CIRCUITS AND METHODS OF MANUFACTURE THEREOF

(71) Applicant: NXP USA, Inc., Austin, TX (US)

(72) Inventors: Jeffrey Spencer Roberts, Tempe, AZ (US); Ning Zhu, Chandler, AZ (US); Olivier Lembeye, Saint Lys (FR); Damon G. Holmes, Scottsdale, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 287 days.

(21) Appl. No.: 17/111,913

(22) Filed: Dec. 4, 2020

(65) Prior Publication Data
US 2021/0175860 A1    Jun. 10, 2021

(30) Foreign Application Priority Data

Dec. 10, 2019    (EP) .................................. 19306611

(51) Int. Cl.
| | | |
|---|---|---|
| H03F 3/193 | (2006.01) | |
| H01L 29/20 | (2006.01) | |
| H03F 1/02 | (2006.01) | |
| H03F 3/21 | (2006.01) | |
| H04B 1/04 | (2006.01) | |

(52) U.S. Cl.
CPC ......... *H03F 3/193* (2013.01); *H01L 29/2003* (2013.01); *H03F 1/0288* (2013.01); *H03F 3/211* (2013.01); *H04B 1/04* (2013.01); *H03F 2200/318* (2013.01); *H04B 2001/045* (2013.01)

(58) Field of Classification Search
CPC ........ H03F 3/193; H03F 1/0288; H03F 3/211; H03F 2200/318; H01L 29/2003; H04B 1/04; H04B 2001/045
USPC ......................................................... 330/277
See application file for complete search history.

(56) References Cited

U.S. PATENT DOCUMENTS

| | | |
|---|---|---|
| 8,659,359 B2 | 2/2014 | Ladhani et al. |
| 9,692,363 B2 | 6/2017 | Zhu et al. |
| 9,979,360 B1 * | 5/2018 | McLaren ................ H03F 3/245 |
| 10,541,653 B2 | 1/2020 | Zhu et al. |
| 10,742,178 B2 | 8/2020 | Zhu et al. |

(Continued)

*Primary Examiner* — Hafizur Rahman
(74) *Attorney, Agent, or Firm* — Sherry Gourlay

(57) ABSTRACT

Embodiments of RF amplifiers and packaged RF amplifier devices each include an amplification path with a transistor die, and an output-side impedance matching circuit having a T-match circuit topology. The output-side impedance matching circuit includes a first inductive element (e.g., first wirebonds) connected between the transistor output terminal and a quasi RF cold point node, a second inductive element (e.g., second wirebonds) connected between the quasi RF cold point node and an output of the amplification path, and a first capacitance connected between the quasi RF cold point node and a ground reference node. The RF amplifiers and devices also include a baseband termination circuit connected to the quasi RF cold point node, which includes an envelope resistor, an envelope inductor, and an envelope capacitor coupled in series between the quasi RF cold point node and the ground reference node.

20 Claims, 7 Drawing Sheets

(56) References Cited

U.S. PATENT DOCUMENTS

| | | |
|---|---|---|
| 10,784,821 B2 | 9/2020 | Zhu et al. |
| 10,784,822 B2 | 9/2020 | Zhu et al. |
| 2008/0315392 A1 | 12/2008 | Farrell et al. |
| 2017/0117856 A1 | 4/2017 | Zhu et al. |
| 2019/0356274 A1 | 11/2019 | Zhu et al. |

* cited by examiner

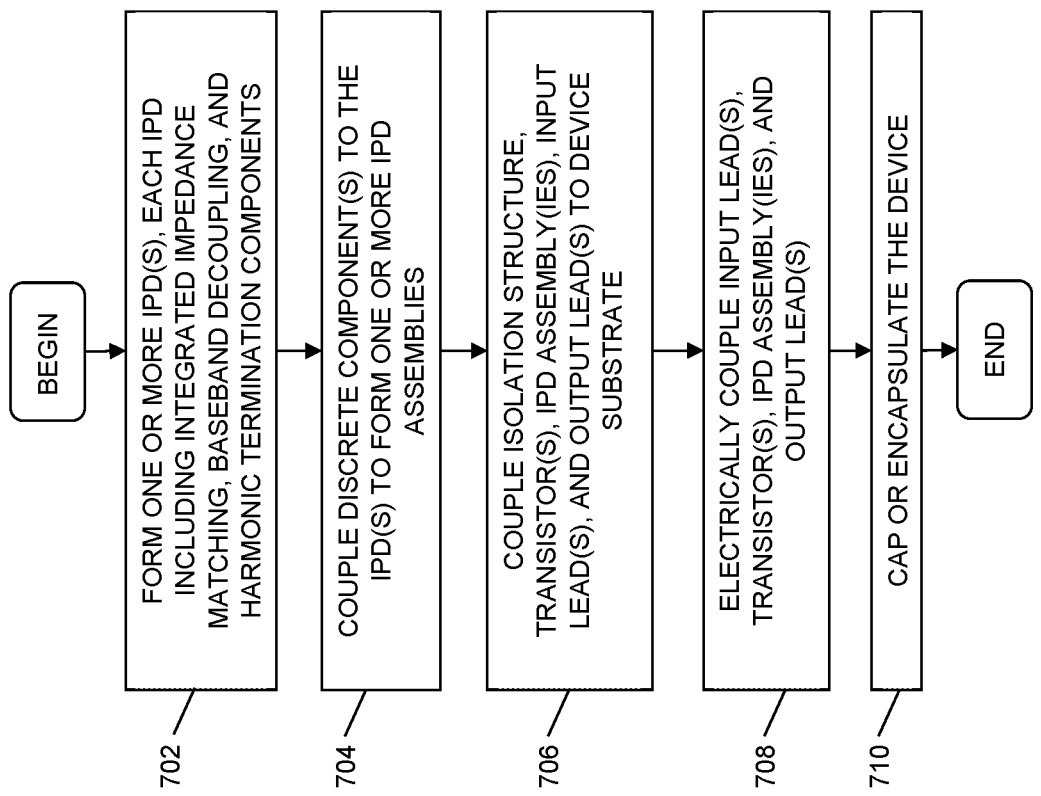

BROADBAND POWER TRANSISTOR DEVICES AND AMPLIFIERS WITH OUTPUT T-MATCH AND HARMONIC TERMINATION CIRCUITS AND METHODS OF MANUFACTURE THEREOF

CROSS-REFERENCE TO RELATED APPLICATION

This application claims the priority under 35 U.S.C. § 119 of European patent application no. 19306611.5, filed Dec. 10, 2019 the contents of which are incorporated by reference herein.

TECHNICAL FIELD

Embodiments of the subject matter described herein relate generally to radio frequency (RF) amplifiers, and more particularly to broadband power transistor devices and amplifiers, and methods of manufacturing such devices and amplifiers.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

In the field of power amplifier device design, it is becoming increasingly desirable to achieve concurrent multi-band, broadband amplification. To successfully design a wideband power amplifier device for concurrent multi-band, broadband operation in a Doherty power amplifier circuit, for example, it is desirable to enable a good broadband fundamental match (e.g., over 20 percent fractional bandwidth) to appropriately handle harmonic frequency interactions, and to enable a wide baseband termination. However, achieving these goals continues to provide challenges to power amplifier device designers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 7 is a flowchart of a method for fabricating a packaged RF power amplifier device that includes an embodiment of an output impedance matching circuit, in accordance with an example embodiment.

DETAILED DESCRIPTION

Figure 1:
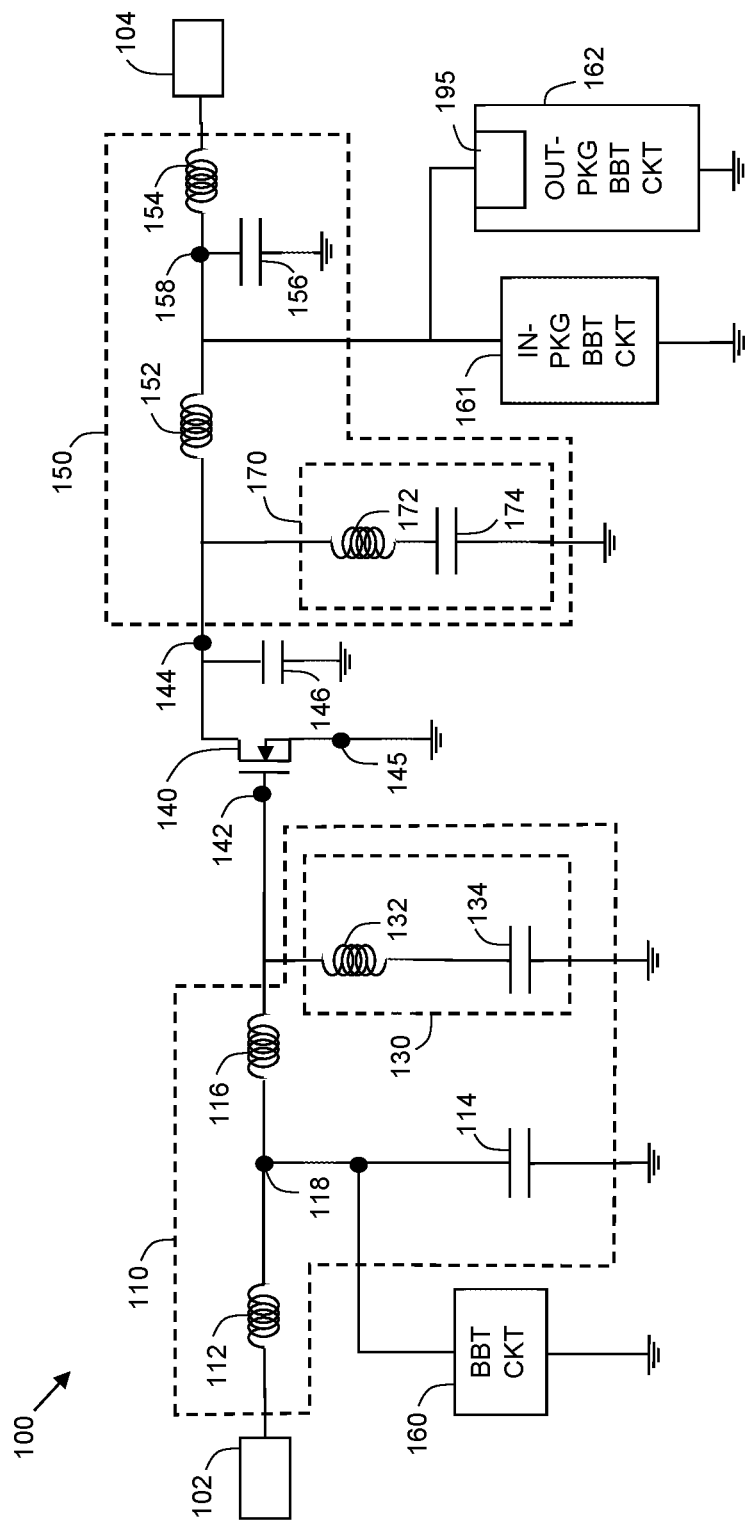
FIG. 1 is a schematic circuit diagram of a power amplifier circuit, in accordance with an example embodiment.

An embodiment of a radio frequency (RF) amplifier has a first amplification path that includes a transistor die with a transistor and a transistor output terminal, and an output-side impedance matching circuit having a T-match circuit topology coupled between the transistor output terminal and an output of the first amplification path. The output-side impedance matching circuit includes a first inductive element connected between the transistor output terminal and a quasi RF cold point node, a second inductive element connected between the quasi RF cold point node and the output of the first amplification path, and a first capacitance connected between the quasi RF cold point node and a ground reference node. The RF amplifier also includes a baseband termination circuit connected to the quasi RF cold point node. The baseband termination circuit includes a plurality of components, which include an envelope resistor, an envelope inductor, and an envelope capacitor coupled in series between the quasi RF cold point node and the ground reference node.

In a further embodiment, the first inductive element includes a first plurality of wirebonds, and the second inductive element includes a second plurality of wirebonds. In another further embodiment, the baseband termination circuit also includes a bypass capacitor coupled in parallel across one or more of the plurality of components of the first baseband termination circuit. In another further embodiment, the bypass capacitor is coupled in parallel across the envelope inductor, and the envelope inductor and the bypass capacitor form a parallel resonant circuit in proximity to a center operating frequency of the RF amplifier. In another further embodiment, the RF amplifier also includes an output-side harmonic termination circuit that includes a third inductive element and a second capacitance connected in series between the transistor output terminal and the ground reference node, and the output-side harmonic termination circuit resonates at a second harmonic frequency of a fundamental frequency of operation of the RF amplifier. In another further embodiment, the first inductive element has an inductance value in a range of 20 picohenries to 3 nanohenries, the second inductive element has an inductance value in a range of 20 picohenries to 3 nanohenries, and the first capacitance has a capacitance value in a range of 10 picofarad to 140 picofarads. In another further embodiment, the third inductive element has an inductance value in a range of 20 picohenries to 3 nanohenries, and the second capacitance has a capacitance value in a range of 1 picofarad to 100 picofarads. In another further embodiment, the envelope resistor has a resistance value in a range of 0.1 ohms to 5.0 ohms, the envelope inductor has an inductance value in a range of 5 picohenries to 3000 picohenries, and the envelope capacitor has a capacitance value in a range of 1 nanofarad to 1 microfarad. In another further embodiment, the transistor is a gallium nitride transistor with a drain-source capacitance below 0.2 picofarads per watt. In another further embodiment, the RF amplifier is a Doherty power amplifier that further includes a second amplification path, a power divider, and a combining node. The power divider has a power divider input configured to receive an RF signal, a first power divider output coupled to an input of the first amplification path, and a second power divider output coupled to an input of the second amplification path. The power divider is configured to divide the RF signal into a first RF signal that is provided to the first amplification path through the first power divider output, and into a second RF signal that is provided to the second amplification path through the second power divider output. The combining node is configured to receive and combine amplified RF signals produced by the first and second amplification paths.

An embodiment of a packaged RF amplifier device includes a device substrate, a first input lead coupled to the device substrate, a first output lead coupled to the device substrate, and a first transistor die coupled to the device substrate. The first transistor die includes a first transistor, a transistor input terminal coupled to the first input lead, and a transistor output terminal coupled to the first output lead, and the first transistor has a drain-source capacitance below 0.2 picofarads per watt. The packaged RF amplifier device also includes a first output-side impedance matching circuit having a T-match circuit topology coupled between the first transistor output terminal and the first output lead. The first output-side impedance matching circuit includes a first inductive element connected between the transistor output terminal and a first quasi RF cold point node, a second inductive element connected between the first quasi RF cold point node and the first output lead, and a first capacitance connected between the first quasi RF cold point node and a ground reference node. The first inductive element includes a first plurality of wirebonds, and the second inductive element includes a second plurality of wirebonds. The packaged RF amplifier device also includes a first baseband termination circuit connected to the first quasi RF cold point node. The first baseband termination circuit includes a first plurality of components, which includes a first envelope resistor, a first envelope inductor, and a first envelope capacitor coupled in series between the first quasi RF cold point node and the ground reference node.

In a further embodiment, the transistor is a gallium nitride transistor. In another further embodiment, the packaged RF amplifier device also includes an integrated passive device coupled to the device substrate between the first transistor die and the first output lead, and the integrated passive device includes the first quasi RF cold point node, the first capacitance, the envelope resistor, the envelope inductor, and the envelope capacitor. In another further embodiment, the packaged RF amplifier device also includes an output-side harmonic termination circuit with a third inductive element and a second capacitance connected in series between the transistor output terminal and the ground reference node, where the third inductive element includes a third plurality of wirebonds, and the output-side harmonic termination circuit resonates at a second harmonic frequency of a fundamental frequency of operation of the RF amplifier. In another further embodiment, the second capacitance is integrally formed with the integrated passive device. In another further embodiment, the packaged RF amplifier device also includes a second baseband termination circuit connected to the first quasi RF cold point node, and the second baseband termination circuit includes a second plurality of components, including a second envelope inductor and a second envelope capacitor coupled in series between the first quasi RF cold point node and the ground reference node. In another further embodiment, the second envelope inductor includes an additional lead with a proximal end electrically coupled to the first quasi RF cold point node, and a distal end exterior to the packaged RF amplifier device, and the second envelope capacitor includes a discrete capacitor with a first terminal coupled to the distal end of the additional lead, and a second terminal coupled to ground. In another further embodiment, the packaged RF amplifier device also includes a second input lead coupled to the device substrate, a second output lead coupled to the device substrate, a second transistor die coupled to the device substrate, where the second transistor die includes a second transistor coupled between the second input lead and the second output lead, a second output-side impedance matching circuit having the T-match circuit topology coupled between the second transistor and the second output lead, and further having a second quasi RF cold point node, and a second baseband termination circuit connected to the second quasi RF cold point node.

An embodiment of a method of manufacturing an RF amplifier device includes coupling an input lead to a device substrate, coupling an output lead to the device substrate, coupling a transistor die to the device substrate between the input and output leads, and coupling an integrated passive device to the device substrate between the transistor die and the input lead. The transistor die includes a transistor and a transistor output terminal, and the transistor has a drain-source capacitance below 0.2 picofarads per watt. The integrated passive device includes a quasi RF cold point node, a ground reference node, a first capacitor coupled between the quasi RF cold point node and the ground node, and a baseband termination circuit, where the baseband termination circuit includes an envelope resistor, an envelope capacitor, and an envelope inductor coupled in series between the quasi RF cold point node and the ground reference node. The method further includes creating an output-side impedance matching circuit with a T-match circuit topology between the transistor output terminal and the output lead, where the T-match circuit topology includes the first capacitor, and the output-side impedance matching circuit is created by coupling a first inductive element between the transistor output terminal and the quasi RF cold point node, and coupling a second inductive element between the quasi RF cold point node and the output lead. The first inductive element includes a first plurality of wirebonds, and the second inductive element includes a second plurality of wirebonds.

According to a further embodiment, the integrated passive device also includes an additional node, and a second capacitance coupled between the additional node and the ground reference node, and the method further includes creating an output-side harmonic termination circuit by coupling a third inductive element between the transistor output terminal and the additional node, where the third inductive element includes a third plurality of wirebonds, and the output-side harmonic termination circuit resonates at a second harmonic frequency of a fundamental frequency of operation of the RF amplifier device.

In the field of high-power radio frequency (RF) power amplification for cellular base stations and other applications, broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth).

For example, the nonlinear input capacitance of RF power devices that include GaN transistors are known to generate harmonic and intermodulation distortion that can impair efficiency and linearity. In addition, when compared with a silicon-based LDMOS transistor, the drain-source capacitance, Cds, of a GaN-based transistor is relatively low on a per RF output peak power basis. For example, whereas an LDMOS transistor may have a drain-source capacitance greater than about 0.4 picofarads per watt (pF/W), a GaN-based transistor may have a drain-source capacitance less than about 0.2 pF/W, in some embodiments, and less than about 0.1 pF/W, in other embodiments.

Second harmonic terminations also play an important role in the overall performance of a power amplifier design that uses GaN-based transistors. Without knowledge of second harmonic impedance at the current source plane, it is very difficult to tune a power amplifier to achieve relatively high fractional bandwidth with good performance. Furthermore, the second harmonic termination may vary significantly across a large bandwidth for broadband applications, which further increases the difficulty of circuit tuning.

To overcome these and other challenges in designing broadband power amplifiers using GaN-based devices, embodiments disclosed herein may achieve broadband output impedance matching at fundamental frequency using an output impedance matching circuitry with a T-match circuit topology (referred to below as a "T-match" circuit). A shunt capacitor in the output-side T-match circuit also may have a high enough capacitance value (e.g., greater than 10 picofarads (pF) but less than 140 pF) to provide an acceptable RF low-impedance point (i.e., a "quasi RF cold point", which represents a low impedance point in the circuit for RF signals). In various embodiments, one or more baseband termination circuits with good RF isolation are connected to the quasi RF cold point.

Further still, in some embodiments, the inductance provided between the transistor output and the shunt capacitor within the output impedance matching circuit may be significantly reduced with the inclusion of a harmonic termination circuit at the output of the device. These harmonic termination circuitry embodiments may be used to control the second harmonic impedance across a wide (e.g., 20 percent plus) fractional bandwidth at relatively low impedance (e.g., close to short circuit). This may be useful in achieving relatively high efficiency for broadband applications. Some specific embodiments of the inventive subject matter include output harmonic termination circuitry that includes an integrated capacitance (e.g., metal-insulator-metal (MIM) capacitor) and an inductance (e.g., in the form of a wirebond array) series-coupled between the transistor output and a ground reference.

During operation of an embodiment of a device, the output-side harmonic termination circuit is essentially equivalent to a capacitor at a fundamental frequency of operation of the device, with the capacitance value being approximately equivalent to the effective capacitance of a series-coupled inductance and capacitance (e.g., inductor 172 and capacitor 174, FIG. 1) of the harmonic termination circuit. Because this equivalent shunt capacitance from the combination of the series-coupled inductance and capacitance is coupled in parallel with the drain-source capacitance between the transistor output and the ground reference, the equivalent shunt capacitance in the harmonic termination circuit effectively increases the drain-source capacitance of the transistor. In some embodiments, the equivalent shunt capacitance from the series-coupled combination of the inductance and capacitance in the harmonic termination circuit has a capacitance value that effectively increases the drain-source capacitance of the transistor to which it is connected by at least 10 percent (e.g., between 10 percent and about 50 percent or more).

FIG. 1 is a schematic diagram of an RF power amplifier circuit 100. Circuit 100 includes an input 102 (e.g., a first conductive package lead), an input impedance matching circuit 110 (which includes a harmonic termination circuit 130), a transistor 140, an output impedance matching circuit 150 (which includes a harmonic termination circuit 170), baseband termination (BBT) circuits 160, 161, 162, and an output lead 104 (e.g., a second conductive package lead), in an embodiment. Each of the input and output 102, 104 may be more generally referred to as an "RF input/output (I/O)."

The input impedance matching circuit 110 (including harmonic termination circuit 130) and baseband termination circuit 160 may be referred to collectively as an "input circuit." Similarly, the output impedance matching circuit 150 (including harmonic termination circuit 170) and baseband termination circuits 161, 162 may be referred to collectively as an "output circuit." According to an embodiment, in the output circuit, the baseband termination circuits include an "in-package" baseband termination circuit 161 (IN-PKG BBT CKT), and an "out-of-package" baseband termination circuit 162 (OUT-PKG BBT CKT). As will be discussed later, whereas the components of the in-package baseband termination circuit 161 may be included within the interior of a power amplifier device (e.g., device 400, FIG. 4), the out-of-package baseband termination circuit 162 may include an additional lead 195 (e.g., a third conductive package lead) and one or more components that are external to the power amplifier device.

Although transistor 140 and various elements of the input and output impedance matching circuits 110, 150, the baseband termination circuits 160-162, and the harmonic termination circuits 130, 170 are shown as singular components, the depiction is for the purpose of ease of explanation only. Those of skill in the art would understand, based on the description herein, that transistor 140 and/or certain elements of the input impedance matching circuit 110 (including the harmonic termination circuit 130), the output impedance matching circuit 150 (including the harmonic termination circuit 170), and the baseband termination circuits 160-162 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 140 and various elements of the input impedance matching circuit 110 (including the harmonic termination circuit 130), the output impedance matching circuit 150 (including the harmonic termination circuit 170), and the baseband termination circuits 160-162, below, thus are not intended to limit the scope of the inventive subject matter only to the illustrated embodiments.

Input 102, output 104, and lead 195 each may include a conductor, which is configured to enable the circuit 100 to be electrically coupled with external circuitry (not shown). More specifically, input 102, output 104, and lead 195 are physically positioned to span between the exterior and the interior of the device's package. Input impedance matching circuit 110 (including harmonic termination circuit 130) and baseband termination circuit 160 are electrically coupled between the input 102 and a first terminal 142 of transistor 140 (e.g., the gate terminal of transistor 140), which is also located within the device's interior. Similarly, output impedance matching circuit 150 (including harmonic termination circuit 170) and in-package baseband termination circuit 161 are electrically coupled between a second terminal 144 of transistor 140 (e.g., the drain terminal of transistor 140) and the output 104. Out-of-package baseband termination circuit 162 is electrically coupled to the second terminal 144 of transistor 140 through lead 195, which also forms an inductive portion of the out-of-package baseband termination circuit 162.

According to an embodiment, transistor 140 is the primary active component of circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate (control terminal 142), a drain (a first current conducting terminal 144), and a source (a second current conducting terminal 145). According to an embodiment, and using nomenclature typically applied to FETs in a non-limiting manner, the gate 142 of transistor 140 is coupled to the input impedance matching circuit 110 (including the harmonic termination circuit 130) and the baseband termination circuit 160, the drain 144 of transistor 140 is coupled to the output impedance matching circuit 150 (including the harmonic termination circuit 170) and the baseband termination circuits 161, 162, and the source 145 of transistor 140 is coupled to ground (or another voltage reference). Through the variation of control signals provided to the gate of transistor 140, the current between the current conducting terminals of transistor 140 may be modulated.

According to various embodiments, transistor 140 is a III-V field effect transistor (e.g., a high electron mobility transistor (HEMT)), which has a relatively low drain-source capacitance, Cds, when compared with a silicon-based FET (e.g., an LDMOS FET). In FIG. 1, the drain-source capacitance of transistor 140 is represented with capacitor 146 between the drain of transistor 140 and a transistor output terminal 144 (e.g., corresponding to transistor output terminal 744, FIG. 7). More specifically, capacitor 146 is not a physical component, but instead models the drain-source capacitance of transistor 140. According to an embodiment, transistor 140 may have a drain-source capacitance that is less than about 0.2 pF/W. Further, in some embodiments, transistor 140 may be a GaN FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a relatively low drain-source capacitance. In other embodiments, the transistor 140 may be implemented as a silicon-based FET (e.g., an LDMOS FET).

Input impedance matching circuit 110 is coupled between the input 102 and the control terminal 142 (e.g., gate) of the transistor 140. Input impedance matching circuit 110 is configured to raise the impedance of circuit 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 has a T-match configuration, which includes two inductive elements 112, 116 (e.g., two sets of wirebonds) and a shunt capacitance 114. A first inductive element 112 (e.g., a first set of wirebonds) is coupled between input 102 and a node 118, which in turn is coupled to a first terminal of capacitor 114, and a second inductive element 116 (e.g., a second set of wirebonds) is coupled between the node 118 (or the first terminal of capacitor 114) and the control terminal 142 of transistor 140. The second terminal of capacitor 114 is coupled to ground (or another voltage reference). The combination of inductive elements 112, 116 and shunt capacitance 114 functions as a low-pass filter. According to an embodiment, the series combination of inductive elements 112, 116 may have an inductance value in a range between about 20 picohenries (pH) to about 3 nanohenries (nH), and shunt capacitance 114 may have a capacitance value in a range between about 5 picofarads (pF) to about 120 pF. In some embodiments, shunt capacitance 114 may have a relatively-large capacitance (e.g., greater than 10 pF but less than 140 pF) to provide an acceptable RF low-impedance point at node 118.

In addition, harmonic termination circuit 130 is coupled between the control terminal 142 (e.g., gate) of transistor 140 and ground (or another voltage reference). Harmonic termination circuit 130 includes inductive element 132 (e.g., a third set of wirebonds) and capacitance 134 coupled in series between the control terminal 142 of transistor 140 and ground (or another voltage reference), and this series combination of elements functions as a low impedance path to ground for signal energy at a harmonic frequency (e.g., a second harmonic of a fundamental frequency of operation of circuit 100). According to an embodiment, inductive element 132 may have an inductance value in a range between about 20 pH to about 3 nH, and capacitance 134 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 132 may have an inductance value of about 120-140 pH, and capacitance 134 may have a capacitance value of about 11-12 pF. The desired inductance and/or capacitance values used to achieve a low impedance path to ground for signal energy at the second harmonic frequency may be affected by mutual coupling between wirebonds used to implement inductors 116 and 132.

According to an embodiment, an RF low-impedance point may present at or coupled to the node 118 between inductive elements 112 and 116, where the RF low-impedance point represents a low impedance point in the circuit for RF signals. According to an embodiment, a baseband termination (BBT) circuit 160 is coupled between node 118 (e.g., or an RF low-impedance point at or coupled to node 118) and the ground reference node. Baseband termination circuit 160 may function to improve the low frequency resonance (LFR) of circuit 100 caused by the interaction between the input matching circuit 110 and the bias feeds (not shown) by presenting a low impedance at envelope frequencies and/or a high impedance at RF frequencies. Baseband termination circuit 160 essentially may be considered to be "invisible" from an RF matching standpoint, as it primarily effects the impedance at envelope frequencies (i.e., baseband termination circuit 160 provides terminations for the envelope frequencies of circuit 100). Only one baseband termination circuit 160 is shown to be coupled to node 118, and when a single baseband termination circuit 160 is implemented in the input circuit, the baseband termination circuit may be an "in-package" baseband termination circuit or an "out-of-package" baseband termination circuit, as defined previously. In an alternate embodiment, both an in-package baseband termination circuit and out-of-package baseband termination circuit may be coupled to node 118, and these in-package and out-of-package, input-side baseband circuits may be implemented similarly to baseband termination circuits 161, 162, discussed below. As will be discussed in more detail later in conjunction with FIGS. 2A-2F, the baseband termination circuit 160 may have any of a number of different circuit configurations, in various embodiments.

On the output side of the circuit 100, output impedance matching circuit 150 is coupled between the first current conducting terminal 144 (e.g., drain) of transistor 140 and the output 104. Output impedance matching circuit 150 is configured to match the output impedance of circuit 100 with the input impedance of an external circuit or component (not shown) that may be coupled to output 104.

According to an embodiment, output impedance matching circuit 150 has a T-match configuration, which includes two inductive elements 152, 154 (e.g., two sets of wirebonds) and a shunt capacitance 156. A first inductive element 152 (e.g., a fourth set of wirebonds) is coupled between terminal 144 of transistor 140 and a node 158, which in turn is coupled to a first terminal of capacitor 156, and a second inductive element 154 (e.g., a fifth set of wirebonds) is coupled between the node 158 (or the first terminal of capacitor 156) and output 104. The second terminal of capacitor 156 is coupled to ground (or another voltage reference). The combination of inductive elements 152, 154 and shunt capacitance 156 functions as a low-pass filter. According to an embodiment, the series combination of inductive elements 152, 154 may have an inductance value in a range between about 20 pH to about 3 nH, and shunt capacitance 156 may have a capacitance value in a range between about 10 pF to about 140 pF. In any event, the value of shunt capacitance 156 is selected to provide an acceptable RF low-impedance point at node 158.

In addition, harmonic termination circuit 170 is coupled between the first current conducting terminal 144 (e.g., drain) of transistor 140 and ground (or another voltage reference). Harmonic termination circuit 170 includes inductive element 172 (e.g., a sixth set of wirebonds) and capacitance 174 coupled in series between the first current conducting terminal 144 of transistor 140 and ground (or another voltage reference), and this series combination of elements functions as another low impedance path to ground for signal energy at a harmonic frequency (e.g., a second harmonic of a fundamental frequency of operation of circuit 100). According to an embodiment, inductive element 172 may have an inductance value in a range between about 20 pH to about 3 nH, and capacitance 174 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 172 may have an inductance value of about 120-140 pH, and capacitance 174 may have a capacitance value of about 11-12 pF. As will be explained later, the desired inductance and/or capacitance values used to achieve a low impedance path to ground for signal energy at the second harmonic frequency may be affected by mutual coupling between wirebonds used to implement inductors 152 and 172.

An RF low-impedance point (also referred to as a "quasi RF cold point node") is present at node 158 between inductive elements 152, 154. Again, the RF low-impedance point 158 represents a low impedance point in the circuit for RF signals. According to various embodiments, one or more additional baseband termination circuits 161, 162 are coupled between the RF low-impedance point 158 and the ground reference node. As will be described in more detail in conjunction with FIGS. 4-6, a first, output-side baseband termination circuit 161 is considered to be an in-package baseband termination circuit, and a second, output-side baseband termination circuit 162 is considered to be an out-of-package baseband termination circuit. Again, baseband termination circuits 161, 162 may function to further improve the LFR of circuit 100 caused by the interaction between the output impedance matching circuit 150 and the bias feeds (not shown) by presenting a low impedance at envelope frequencies and/or a high impedance at RF frequencies. Baseband termination circuits 161, 162 also may be considered to be "invisible" from an RF matching standpoint.

As will now be described in conjunction with FIGS. 2A-2F, each of the baseband termination circuits 160-162 may have any of a number of different circuit configurations, in various embodiments. For example, FIGS. 2A-2F illustrate six example embodiments of baseband termination circuits (e.g., baseband termination circuits 160-162, FIG. 1). In each of FIGS. 2A-2F, baseband termination circuit 200, 201, 202, 203, 204, 205 is coupled between a connection node 218 (e.g., node 118 and/or node 158, FIG. 1) and ground (or another voltage reference). Further, each baseband termination circuit 200-205 includes an envelope inductance 262, $L_{env}$, an envelope resistor 264, $R_{env}$, and an envelope capacitor 266, $C_{env}$, coupled in series between the connection node 218 and ground. In each of FIGS. 2A-2E, a first terminal of envelope inductance 262 is coupled to node 218, and a second terminal of envelope inductance 262 is coupled to node 280. A first terminal of envelope resistor 264 is coupled to node 280, and a second terminal of envelope resistor 264 is coupled to node 282. A first terminal of envelope capacitor 266 is coupled to node 282, and a second terminal of the envelope capacitor 266 is coupled to ground (or another voltage reference). Although the order of the series of components between node 218 and the ground reference node is the envelope inductance 262, the envelope resistor 264, and the envelope capacitor 266 in FIGS. 2A-2E, the order of components in the series circuit could be different, in other embodiments. For example, in FIG. 2F, the envelope resistor 264 is coupled between node 218 and a node 284, the envelope inductance 262 is coupled between node 284 and a node 286, and the envelope capacitor 266 is coupled between node 286 and ground (or another voltage reference).

Referring to FIGS. 2A-2F, and according to an embodiment, the envelope inductance 262, may be implemented as an integrated inductance (e.g., inductance 562, FIG. 5), as a discrete inductor, and/or as one or more conductors (e.g., one of leads 492-495, FIG. 4 in series with a set of wirebonds, such as wirebonds 590, FIG. 5) coupling the connection node 218 to the envelope resistor 264 (e.g., via node 280). For example, and as will be described in detail later, when a baseband termination circuit 201-205 forms a portion of an in-package baseband termination circuit (e.g., BBT circuits 160, 161, FIG. 1), envelope inductance 262 may be integrally formed as a portion of an integrated passive device (IPD), such as IPD 480-483, FIGS. 4-6. Alternatively, when a baseband termination circuit 201-205 forms a portion of an out-of-package baseband termination circuit (e.g., BBT circuit 162, FIG. 1), envelope inductance 262 may include one or more series-coupled inductances (e.g., one of leads 492-495, FIG. 4 in series with a set of wirebonds, such as wirebonds 590, FIG. 5) configured to provide a signal path between the interior of the package to the exterior of the package. For example, envelope inductance 262 may have an inductance value in a range between about 5 pH to about 3000 pH. For an in-package baseband termination circuit (e.g., BBT circuits 160, 161, FIG. 1), envelope inductance 262 desirably has an inductance value less than about 500 pH (e.g., as low as 50-150 pH, in an embodiment, or possibly even lower). For an out-of-package baseband termination circuit (e.g., BBT circuit 162, FIG. 1), envelope inductance 262 may be significantly higher (e.g., between 1000 pH and 3000 pH. In other embodiments, the value of envelope inductance 262 may be lower or higher than the above-given ranges.

Envelope resistor 264 may be implemented as an integrated resistor (e.g., resistor 564, FIG. 5), in an embodiment, or as a discrete resistor, in another embodiment. For example, when a baseband termination circuit 201-205 forms a portion of an in-package baseband termination circuit (e.g., BBT circuits 160, 161, FIG. 1), envelope resistor 264 may be integrally formed as a portion of an IPD, such as IPD 480-483, FIGS. 4-6. Alternatively, when a baseband termination circuit 201-205 forms a portion of an out-of-package baseband termination circuit (e.g., BBT circuit 162, FIG. 1), the envelope resistor may be excluded from the baseband termination circuit, or the envelope resistor 264 may include the inherent resistance of a package lead (e.g., lead 195, 495, FIGS. 1, 4), or may be otherwise provided. In an embodiment, envelope resistor 264 may have a resistance value in a range between about 0.1 ohm to about 5.0 ohm, although envelope resistor 264 may have a resistance value outside of this range, as well.

Envelope capacitor 266 may be implemented as an integrated capacitor (e.g., capacitor 566, FIG. 5), in an embodiment, or as a discrete capacitor (e.g., as one of discrete capacitors 498, 499, FIG. 4), in another embodiment. For example, when a baseband termination circuit 201-205 forms a portion of an in-package baseband termination circuit (e.g., BBT circuits 160, 161, FIG. 1), envelope capacitor 266 may be integrally formed as a portion of an IPD, such as IPD 480-483, FIGS. 4-6. Alternatively, when a baseband termination circuit 201-205 forms a portion of an out-of-package baseband termination circuit (e.g., BBT circuit 162, FIG. 1), envelope capacitor 266 may be implemented as a discrete capacitor (e.g., as one of discrete capacitors 498, 499, FIG. 4) with a first terminal coupled to the distal end of a package lead (e.g., one of leads 494, 495, FIG. 4), and a second terminal coupled to a ground reference point for a PCB to which the amplifier device is coupled. In an embodiment, for an in-package baseband termination circuit (e.g., BBT circuits 160, 161, FIG. 1), envelope capacitor 266 may have a capacitance value in a range between about 1 nanofarad (nF) to about 1 microfarad (μF), whereas for an out-of-package baseband termination circuit (e.g., BBT circuit 162, FIG. 1), envelope capacitor 266 may have a significantly higher value (e.g., a capacitance value in a range between about 1 μF and 20 μF). In other embodiments, envelope capacitor 266 may have a capacitance value outside of these ranges, as well.

Figure 2C:
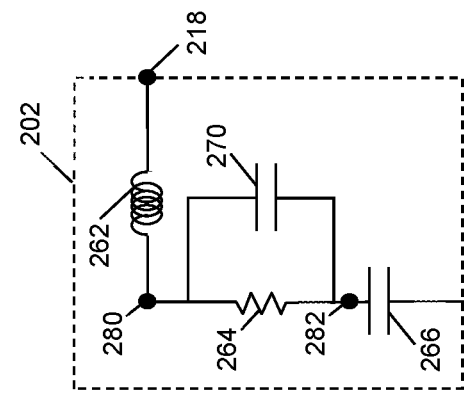
FIGS. 2A-2F illustrate various example embodiments of baseband termination circuits.
Figure 2F:
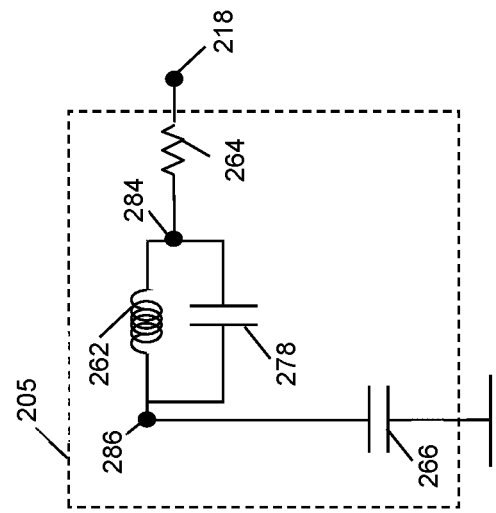
Figure 2B:
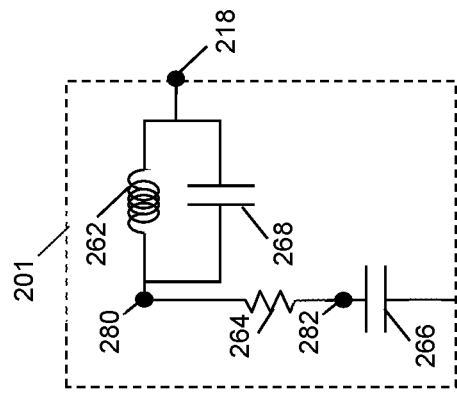
Figure 2E:
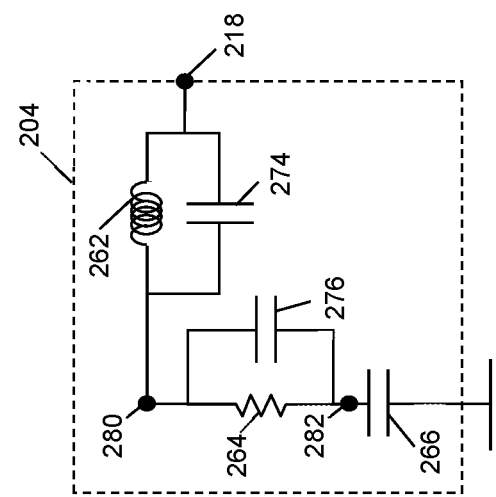
Figure 2A:
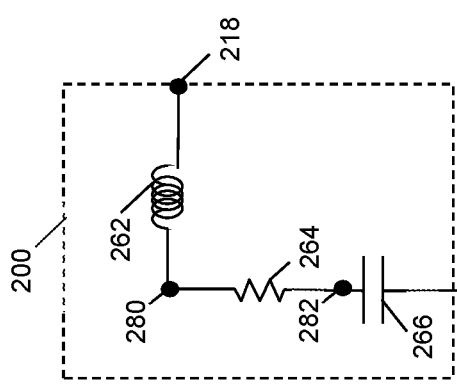

The first embodiment of baseband termination circuit 200 illustrated in FIG. 2A includes a simple series combination of envelope inductance 262, envelope resistor 264, and envelope capacitor 266. Conversely, in the embodiments of FIGS. 2B-2F, the baseband termination circuit 201-205 may include one or more "bypass" or "parallel" capacitors 268, 270, 272, 274, 276, 278, $C_{para}$, which are coupled in parallel with the envelope inductance 262 and/or the envelope resistor 264. Each of the bypass capacitors 268, 270, 272, 274, 276, 278 may be implemented as a discrete capacitor (e.g., capacitor 578, FIG. 5), in some embodiments, or as an integrated capacitor, in other embodiments. In each of these embodiments, a bypass capacitor 268, 270, 272, 274, 276, 278 may have a capacitance value in a range between about 3.0 pF to about 1400 pF. In other embodiments, the value of any of bypass capacitors 268, 270, 272, 274, 276, 278 may be lower or higher than the above-given range.

In the baseband termination circuit 201 of FIG. 2B, bypass capacitor 268, $C_{para}$, is coupled in parallel with the envelope inductance 262. More specifically, first terminals of envelope inductance 262 and bypass capacitor 268 are coupled to node 218, and second terminals of envelope inductance 262 and bypass capacitor 268 are coupled to node 280.

In the baseband termination circuit 202 of FIG. 2C, bypass capacitor 270, $C_{para}$, is coupled in parallel with the envelope resistor 364. More specifically, first terminals of envelope resistor 264 and bypass capacitor 270 are coupled to node 280, and second terminals of envelope resistor 264 and bypass capacitor 270 are coupled to node 282.

Figure 2D:
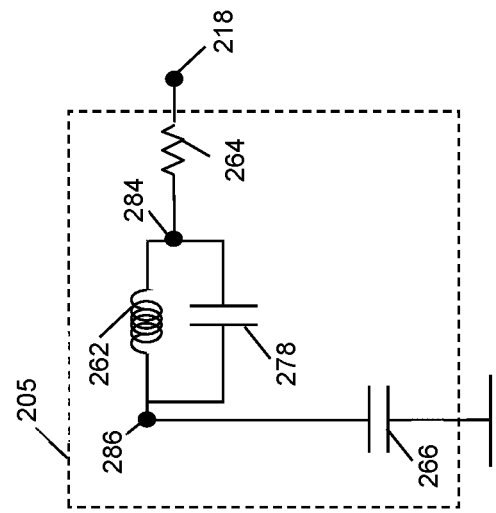

In the baseband termination circuit 203 of FIG. 2D, bypass capacitor 272, $C_{para}$, is coupled in parallel with the envelope inductance 262 and envelope resistor 264. More specifically, bypass capacitor 272 is coupled across nodes 218 and 282.

In the baseband termination circuit 204 of FIG. 2E, a first bypass capacitor 274, $C_{para1}$, is coupled in parallel with the envelope inductance 262, and a second bypass capacitor 276, $C_{para2}$, is coupled in parallel with the envelope resistor 264. More specifically, first terminals of envelope inductance 262 and first bypass capacitor 274 are coupled to node 218, and second terminals of envelope inductance 262 and first bypass capacitor 274 are coupled to node 280. In addition, first terminals of envelope resistor 264 and second bypass capacitor 276 coupled to node 280, and second terminals of envelope resistor 264 and second bypass capacitor 276 are coupled to node 282.

Referring to the baseband termination circuits 201, 204, and 205 of FIGS. 2B, 2E, and 2F, parallel-coupled inductance 262 and capacitor 268, 274 or 278 form a parallel resonant circuit at frequencies in proximity to the center operational frequency of the device or circuit (e.g., circuit 100) within which circuit 201, 204 or 205 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}//C_{para}$ form a parallel resonant circuit at frequencies in proximity to the center operational frequency of the device, the parallel resonant circuit $L_{env}//C_{para}$ essentially appears as an open circuit to such frequencies. Accordingly, RF energy near the center operational frequency that may be present at the node 218 to which circuit 201, 204 or 205 is coupled will be deflected by the parallel resonant circuit $L_{env}//C_{para}$. This deflection may be provided even using a relatively low inductance value for inductance 262. For these reasons, circuits 201, 204, and 205 may significantly improve the LFR of a device or circuit (e.g., circuit 100) in which it is incorporated by presenting a low impedance at envelope frequencies and a high impedance at RF frequencies.

In each of the embodiments of baseband termination circuits 202, 203, 204 of FIGS. 2C, 2D, and 2E, bypass capacitor 270, 272 or 276 is coupled in parallel with envelope resistor 264. Because capacitor 270, 272 or 276 may function to route RF current around the envelope resistor 264, circuits 202, 203, 204 may result in a reduction in the RF current dissipated by the envelope resistor 264. This characteristic of circuits 202, 203, 204 also may serve to better protect the envelope resistor 264 from potential compromise due to excessive current that may otherwise flow through the envelope resistor 264 in the absence of bypass capacitor 270, 272 or 276. Each of circuits 201-205 may increase the device efficiency, when compared with circuit 200, since they allow less RF current to flow through (and be dissipated by) the envelope resistor 264.

Referring again to FIG. 1, and as will be described in more detail later in conjunction with FIGS. 4-6, various embodiments of RF amplifier devices may include at least one input-side integrated passive device (IPD) assembly (e.g., IPD assemblies 480, 481, FIG. 4), and at least one output-side IPD assembly (e.g., IPD assemblies 482, 483, FIGS. 4-6). The input-side IPD assembly(ies) (e.g., IPD assemblies 480, 481) include portions of the input circuit 110 (including the harmonic termination circuit 130) and the baseband termination circuit 160. Similarly, the output-side IPD assemblies (e.g., IPD assemblies 482, 483) include portions of the output circuit 150 (including the harmonic termination circuit 170) and the in-package baseband termination circuit 161. More specifically, each IPD assembly may include a semiconductor substrate with one or more integrated passive components. In a particular embodiment, each input-side IPD assembly may include shunt capacitances 114 and 134, and components of baseband termination circuit 160 (e.g., components 262, 264, 266, 268, 270, 272, 274, 276, 278, FIGS. 2A-2F). In other particular embodiments, each output-side IPD assembly may include shunt capacitances 156 and 174, and components of in-package baseband termination circuit 161 (e.g., components 262, 264, 266, 268, 270, 272, 274, 276, 278, FIGS. 2A-2F).

In other embodiments, some portions of the input and output impedance matching circuits 110, 150 and baseband termination circuits 160-162 may be implemented as distinct/discrete components or as portions of other types of assemblies (e.g., a low-temperature co-fired ceramic (LTCC) device, a small PCB assembly, and so on). In still other embodiments, some portions of the input and/or output impedance matching circuits 110, 150 may be coupled to and/or integrated within the semiconductor die that includes transistor 140. The below, detailed description of embodiments that include IPD assemblies should not be taken to limit the inventive subject matter, and the term "passive device substrate" or "IPD substrate" means any type of structure that includes a passive device, including an IPD, a LTCC device, a transistor die, a PCB assembly, and so on.

In various embodiments, amplifier circuit 100 also may include bias circuitry (not shown in FIG. 1). To provide a bias voltage to the gate terminal 142 and/or to the drain terminal 144 of the transistor 140, an external bias circuit (not shown) may be connected through the input 102, the output 104, and/or through additional package leads to the gate terminal 142 and/or to the drain terminal 144 of the transistor 140, and the bias voltage(s) may be provided through the input 102, output 104, and/or additional leads.

The RF amplifier circuit 100 of FIG. 1 may be utilized as a single-path amplifier, which receives an RF signal at input 102, amplifies the signal through transistor 140, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 3:
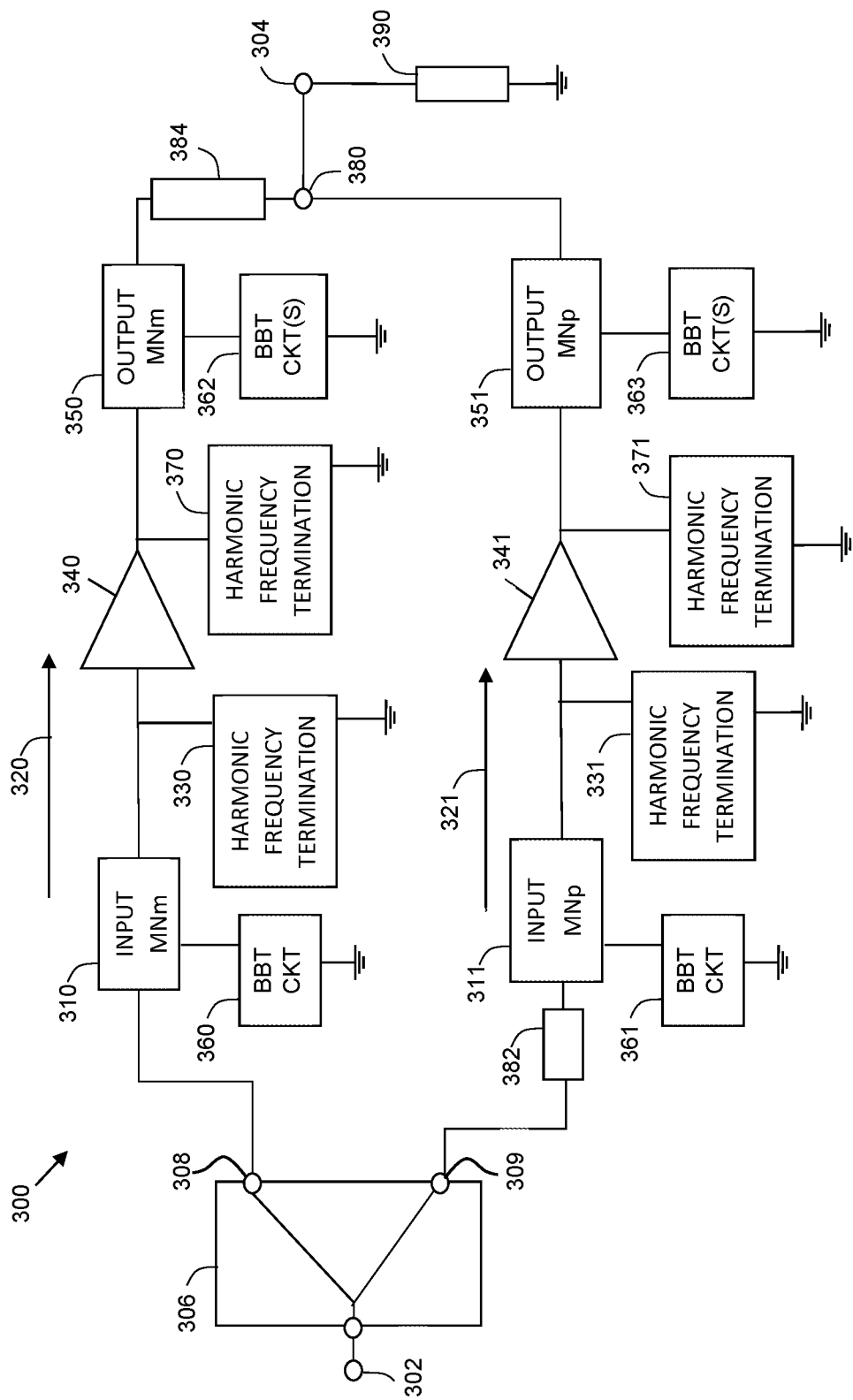
FIG. 3 is a simplified schematic diagram of a Doherty power amplifier, in accordance with an example embodiment.

For example, FIG. 3 is a simplified schematic diagram of a Doherty power amplifier 300 in which embodiments of RF power amplifier circuit 100 may be implemented. Amplifier 300 includes an input node 302, an output node 304, a power divider 306 (or splitter), a main amplifier path 320, a peaking amplifier path 321, and a combining node 380. A load 390 may be coupled to the combining node 380 (e.g., through an impedance transformer, not shown) to receive an amplified RF signal from amplifier 300.

Power divider 306 is configured to divide the power of an input RF signal received at input node 302 into main and peaking portions of the input signal. The main input signal is provided to the main amplifier path 320 at power divider output 308, and the peaking input signal is provided to the peaking amplifier path 321 at power divider output 309. During operation in a full-power mode when both the main and peaking amplifiers 340, 341 are supplying current to the load 390, the power divider 306 divides the input signal power between the amplifier paths 320, 321. For example, the power divider 306 may divide the power equally, such that roughly one half of the input signal power is provided to each path 320, 321 (e.g., for a symmetric Doherty amplifier configuration). Alternatively, the power divider 306 may divide the power unequally (e.g., for an asymmetric Doherty amplifier configuration).

Essentially, the power divider 306 divides an input RF signal supplied at the input node 302, and the divided signals are separately amplified along the main and peaking amplifier paths 320, 321. The amplified signals are then combined in phase at the combining node 380. It is important that phase coherency between the main and peaking amplifier paths 320, 321 is maintained across a frequency band of interest to ensure that the amplified main and peaking signals arrive in phase at the combining node 380, and thus to ensure proper Doherty amplifier operation.

Each of the main amplifier 340 and the peaking amplifier 341 includes one or more single-stage or multiple-stage power transistor integrated circuits (ICs) (or power transistor die) for amplifying an RF signal conducted through the amplifier 340, 341. According to various embodiments, all amplifier stages or a final amplifier stage of either or both the main amplifier 340 and/or the peaking amplifier 341 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 340 or the peaking amplifier 341 is implemented as a III-V FET, the other amplifier may be implemented as a silicon-based FET (e.g., an LDMOS FET), in some embodiments. In still other embodiments, both the main amplifier 340, and/or the peaking amplifier 341 may be implemented as a silicon-based FET.

Although the main and peaking power transistor ICs may be of equal size (e.g., in a symmetric Doherty configuration), the main and peaking power transistor ICs may have unequal sizes, as well (e.g., in various asymmetric Doherty configurations). In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s). Peaking-to-main amplifier IC size ratios other than a 2:1 ratio may be implemented, as well.

During operation of Doherty amplifier 300, the main amplifier 340 is biased to operate in class AB mode, and the peaking amplifier 341 is biased to operate in class C mode. At low power levels, where the power of the input signal at node 302 is lower than the turn-on threshold level of peaking amplifier 341, the amplifier 300 operates in a low-power (or back-off) mode in which the main amplifier 340 is the only amplifier supplying current to the load 390. When the power of the input signal exceeds a threshold level of the peaking amplifier 341, the amplifier 300 operates in a high-power mode in which the main amplifier 340 and the peaking amplifier 341 both supply current to the load 390. At this point, the peaking amplifier 341 provides active load modulation at combining node 380, allowing the current of the main amplifier 340 to continue to increase linearly.

Input and output impedance matching networks 310, 350 (input MNm, output MNm) may be implemented at the input and/or output of the main amplifier 340. Similarly, input and output impedance matching networks 311, 351 (input MNp, output MNp) may be implemented at the input and/or output of the peaking amplifier 341. In each case, the matching networks 310, 311, 350, 351 may be used to incrementally increase the circuit impedance toward the load impedance and source impedance. As discussed previously, in a particular embodiment, the input and output impedance matching networks 310, 311, 350, 351 each may have a T-match circuit topology that includes a quasi cold point node (e.g., node 118, 158, FIG. 1). Baseband termination circuits 360, 361, 362, 363 (e.g., BBT circuits 160-162, FIG. 1) may be coupled between these quasi cold point nodes and the ground reference. All or portions of the input and output impedance matching networks 310, 311, 350, 351 and the baseband termination circuits 360-363 may be implemented inside a power transistor package that includes the main and/or peaking amplifiers 340, 341.

In addition, embodiments of the inventive subject matter include harmonic frequency termination circuits 330, 331 coupled between the inputs of amplifiers 340, 341 and a ground reference. Still other embodiments of the inventive subject matter include harmonic frequency termination circuits 370, 371 coupled between the outputs of amplifiers 340, 341 and a ground reference. The harmonic frequency termination circuits 330, 331, 370, 371 are configured to control the harmonic impedance across a relatively wide fractional bandwidth. For example, the harmonic frequency termination circuits 330, 331, 370, 371 may provide a low impedance path to ground for signal energy at the second harmonic of the center frequency of operation, fo, of the amplifier 300 (also referred to herein as the "fundamental frequency" of operation).

Doherty amplifier 300 has a "non-inverted" load network configuration. In the non-inverted configuration, the input circuit is configured so that an input signal supplied to the peaking amplifier 341 is delayed by 90 degrees with respect to the input signal supplied to the main amplifier 340 at the center frequency of operation, fo, of the amplifier 300. To ensure that the main and peaking input RF signals arrive at the main and peaking amplifiers 340, 341 with about 90 degrees of phase difference, as is fundamental to proper Doherty amplifier operation, phase delay element 382 applies about 90 degrees of phase delay to the peaking input signal. For example, phase delay element 382 may include a quarter wave transmission line, or another suitable type of delay element with an electrical length of about 90 degrees.

To compensate for the resulting 90 degree phase delay difference between the main and peaking amplifier paths 320, 321 at the inputs of amplifiers 340, 341 (i.e., to ensure that the amplified signals arrive in phase at the combining node 380), the output circuit is configured to apply about a 90 degree phase delay to the signal between the output of main amplifier 340 and the combining node 380. This is achieved through an additional delay element 384. Alternate embodiments of Doherty amplifiers may have an "inverted" load network configuration. In such a configuration, the input circuit is configured so that an input signal supplied to the main amplifier 340 is delayed by about 90 degrees with respect to the input signal supplied to the peaking amplifier 341 at the center frequency of operation, fo, of the amplifier 300, and the output circuit is configured to apply about a 90 degree phase delay to the signal between the output of peaking amplifier 341 and the combining node 380.

Amplifiers 340 and 341, along with harmonic frequency termination circuits 330, 331, 370, 371 and all or portions of matching networks 310, 311, 350, 351 and baseband termination circuits 360-363 may be implemented in discrete, packaged power amplifier devices. In such devices, input and output leads are coupled to a substrate, and each amplifier 340, 341 may include a single-stage or multi-stage power transistor also coupled to the substrate. Portions of the harmonic frequency termination circuits 330, 331, 370, 371 and the input and output matching networks 310, 311, 350, 351 may be implemented as additional components within the packaged device. Further, as is described in detail below, portions of the baseband termination circuits 360-363 (e.g., embodiments of baseband termination circuits 160-162, FIG. 1, illustrated in FIGS. 2A-2F) also may be implemented as additional components within the packaged device.

Figure 4:
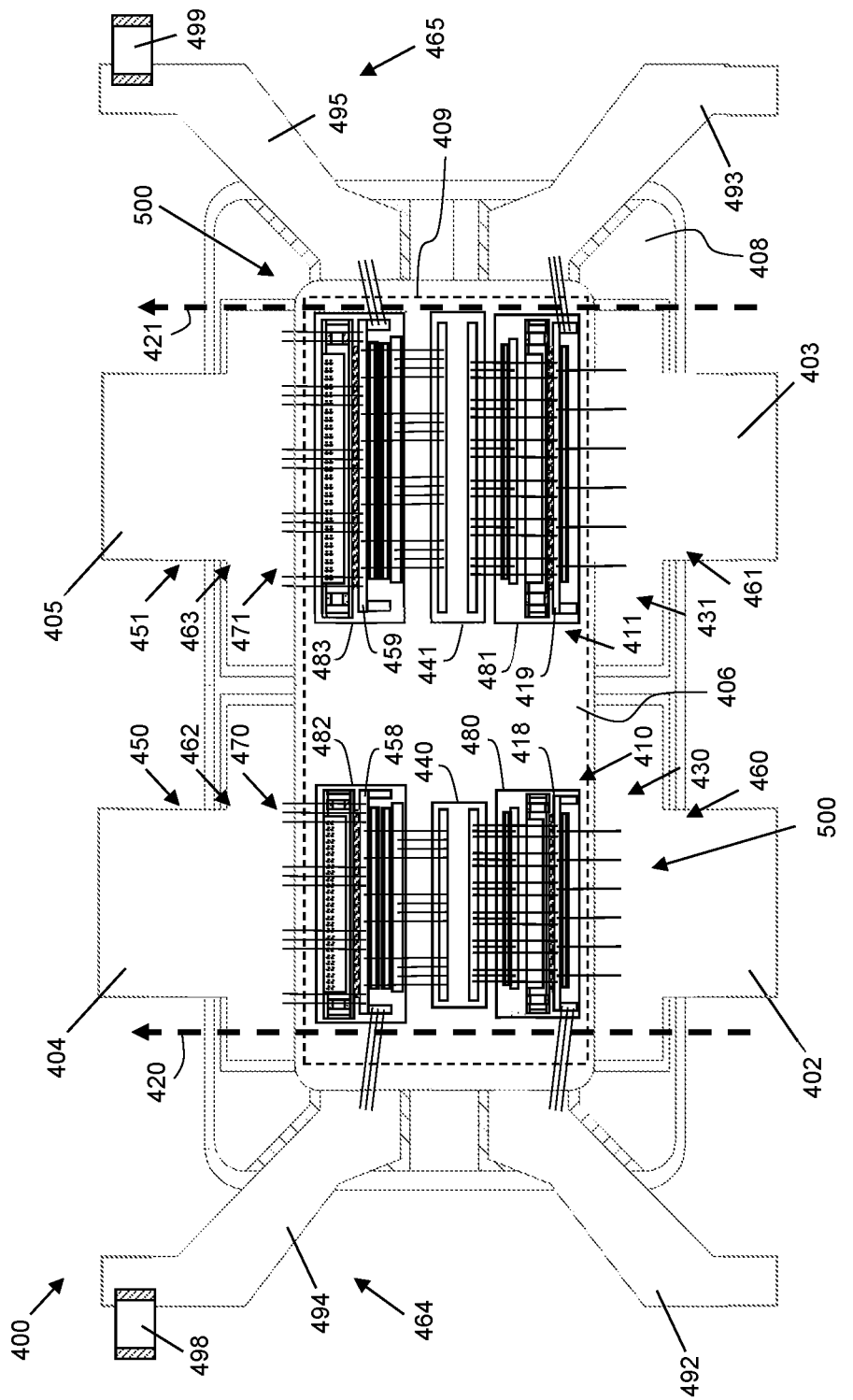
FIG. 4 is a top view of a packaged RF power amplifier device that includes two parallel amplification paths, in accordance with an example embodiment.

For example, FIG. 4 is a top view of an embodiment of a packaged RF amplifier device 400 that embodies two parallel instances of the circuit 100 of FIG. 1, and which may be utilized to provide amplifiers (e.g., amplifiers 340, 341, FIG. 3), and portions of matching networks (e.g., portions of matching networks 310, 311, 350, 351, FIG. 3) in a Doherty amplifier (e.g., Doherty amplifier 300, FIG. 3). In addition, as will be described in more detail below, device 400 includes two input-side IPD assemblies 480, 481, each of which includes portions of an input impedance matching circuit 410, 411 (e.g., circuit 110, 310, 311 FIGS. 1, 3), a baseband termination circuit 460, 461 (e.g., circuit 160, 360, 361, FIGS. 1, 3), and a harmonic termination circuit 430, 431 (e.g., circuit 130, 330, 331, FIGS. 1, 3). Further, device 400 includes two output-side IPD assemblies 482, 483, each of which includes portions of an output impedance matching circuit 450, 451 (e.g., circuit 150, 350, 351 FIGS. 1, 3), an in-package baseband termination circuit 462, 463 (e.g., circuit 161, 362, 363, FIGS. 1, 3), and a harmonic termination circuit 470, 471 (e.g., circuit 170, 370, 371, FIGS. 1, 3). For each amplification path 420, 431, an out-of-package baseband termination circuit 464, 465 (e.g., circuit 162, 362, 363, FIGS. 1, 3) also may be provided at the output side of the device 400.

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for transistor dies 440, 441 and other devices mounted on flange 406. Flange 406 has top and bottom surfaces (only a central portion of the top surface is visible in FIG. 4), and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. Isolation structure 408, which is formed from a rigid, electrically insulating material, provides electrical isolation between conductive features of the device (e.g., between leads 402-405 and flange 406). Isolation structure 408 has a frame shape, in an embodiment, which includes a substantially enclosed, four-sided structure with a central opening. Isolation structure 408 may have a substantially rectangular shape, as shown in FIG. 4, or isolation structure 408 may have another shape (e.g., annular ring, oval, and so on).

A portion of the top surface of flange 406 that is exposed through the opening in isolation structure 408 is referred to herein as the "active area" of device 400. Transistor dies 440, 441 are positioned within the active device area of device 400, along with IPD assemblies 480, 481, 482, 483, which will be described in more detail later. For example, the transistor dies 440, 441 and IPD assemblies 480-483 may be coupled to the top surface of flange 406 using conductive epoxy, solder, solder bumps, sintering, and/or eutectic bonds.

Device 400 houses two amplification paths (indicated with arrows 420, 421), where each amplification path 420, 421 represents a physical implementation of circuit 100 (FIG. 1). When incorporated into a Doherty amplifier (e.g., Doherty amplifier 300, FIG. 3), amplification path 420 may correspond to a main amplifier path (e.g., main amplifier path 320, FIG. 3), and amplification path 421 may correspond to a peaking amplifier path (e.g., peaking amplifier path 321, FIG. 3).

Each path 420, 421 includes an input lead 402, 403 (e.g., input 102, FIG. 1), an output lead 404, 405 (e.g., output 104, FIG. 1), one or more transistor dies 440, 441 (e.g., transistor 140, FIG. 1 or amplifiers 340, 341, FIG. 3), an input impedance matching circuit 410, 411 (e.g., input impedance matching circuit 110, FIG. 1 or portions of input matching networks 310, 311, FIG. 3), an output impedance matching circuit 450, 451 (e.g., output impedance matching circuit 150, FIG. 1 or portions of output matching networks 350, 351, FIG. 3), an input-side baseband termination circuit 460, 461 (e.g., baseband termination circuit 160, 360, 361, FIGS. 1, 3), output-side baseband termination circuits 462, 463, 464, 465 (e.g., baseband termination circuits 161, 162, 362, 363, FIGS. 1, 3), an input-side harmonic termination circuit 430, 431 (e.g., harmonic termination circuit 130, 330, 331, FIGS. 1, 3), and an output-side harmonic termination circuit 470, 471 (e.g., harmonic termination circuit 170, 370, 371, FIGS. 1, 3).

The input and output leads 402-405 are mounted on a top surface of the isolation structure 408 on opposed sides of the central opening, and thus the input and output leads 402-405 are elevated above the top surface of the flange 406, and are electrically isolated from the flange 406. Generally, the input and output leads 402-405 are oriented to allow for attachment of wirebonds between the input and output leads 402-405 and components and elements within the central opening of isolation structure 408.

Each transistor die 440, 441 includes an integrated power FET, where each FET has a control terminal (e.g., a gate) and two current conducting terminals (e.g., a drain and a source). A control terminal of a FET within each transistor die 440, 441 is coupled through an input impedance matching circuit 410, 411 to an input lead 402, 403. In addition, one current conducting terminal (e.g., the drain) of a FET within each transistor die 440, 441 is coupled through an output impedance matching circuit 450, 451 to an output lead 404, 405. The other current conducting terminal (e.g., the source) of a FET within each transistor die 440, 441 is electrically coupled through the die 440, 441 to the flange 406 (e.g., to ground), in an embodiment.

Embodiments of the input impedance matching circuits 410, 411, baseband termination circuits 460, 461, and harmonic termination circuits 430, 431 are not discussed in detail herein. Suffice it to be said that some of the components of these circuits may be implemented within IPD assemblies 480, 481. Briefly, each input impedance matching circuit 410, 411 is coupled between an input lead 402, 403 and the control terminal of a FET within a transistor die 440, 441. Each input-side baseband termination circuit 460, 461 is coupled between a node 418, 419 (e.g., a conductive bond pad corresponding to node 118, FIG. 1) within IPD assembly 480, 481 and a ground reference (e.g., flange 406). Each harmonic termination circuit 430, 431 is coupled between the control terminal (e.g., the gate) of a FET within a transistor die 440, 441 and the ground reference (e.g., flange 406).

Embodiments of the output impedance matching circuits 450, 451, baseband termination circuits 462, 463, and harmonic termination circuits 470, 471 will be described in more detail in conjunction with FIGS. 5 and 6, which illustrate the components of these circuits 450, 451, 462, 463, 470, 471 in greater detail. As will be explained in conjunction with FIGS. 5 and 6, some of the components of these circuits may be implemented within IPD assemblies 482, 483. Briefly, each output impedance matching circuit 450, 451 is coupled between a current conducting terminal (e.g., the drain) of a FET within a transistor die 440, 441 and an output lead 404, 405. Each baseband termination circuit 462, 463 is coupled between a node 458, 459 (e.g., an RF low-impedance point (or a quasi RF cold point node) in the form of a conductive bond pad corresponding to node 158, FIG. 1) within IPD assembly 482, 483 and a ground reference (e.g., flange 406). Each harmonic termination circuit 470, 471 is coupled between the current conducting terminal (e.g., the drain) of a FET within a transistor die 440, 441 and the ground reference (e.g., flange 406).

In the example of FIG. 4, device 400 includes two transistor dies 440, 441 that essentially function in parallel, although another semiconductor device may include a single transistor die or more than two transistor dies, as well. In addition, device 400 includes two input-side IPD assemblies 480, 481 and two output-side IPD assemblies 482, 483, which also essentially function in parallel. It is to be understood that more or fewer of IPD assemblies 480-483 may be implemented, as well.

According to an embodiment, device 400 is incorporated in an air cavity package, in which transistor dies 440, 441, the IPD assemblies 480-483, and various other components are located within an enclosed air cavity. Basically, the air cavity is bounded by flange 406, isolation structure 408, and a cap (not shown) overlying and in contact with the isolation structure 408 and leads 402-405. In FIG. 4, an example perimeter of the cap is indicated by dashed box 409. In other embodiments, the components of device 400 may be incorporated into an overmolded package (i.e., a package in which the electrical components within the active device area are encapsulated with a non-conductive molding compound, and in which portions of the leads 402-405 also may be encompassed by the molding compound). In an overmolded package, isolation structure 408 may be excluded.

Figure 5:
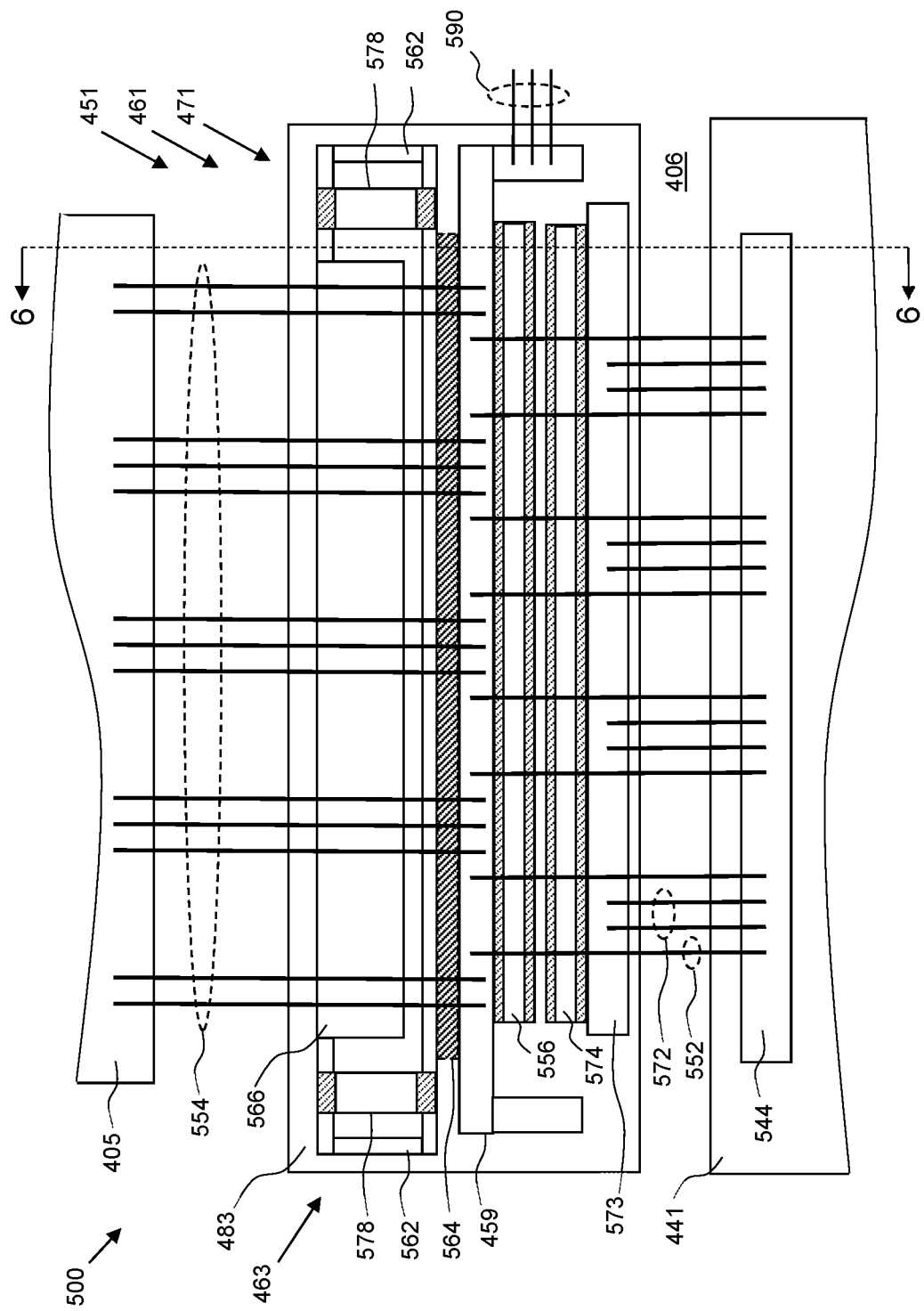
FIG. 5 is a top view of a portion of a packaged RF power amplifier device, including a portion of a power transistor and an output impedance matching circuit, in accordance with an example embodiment.
Figure 6:
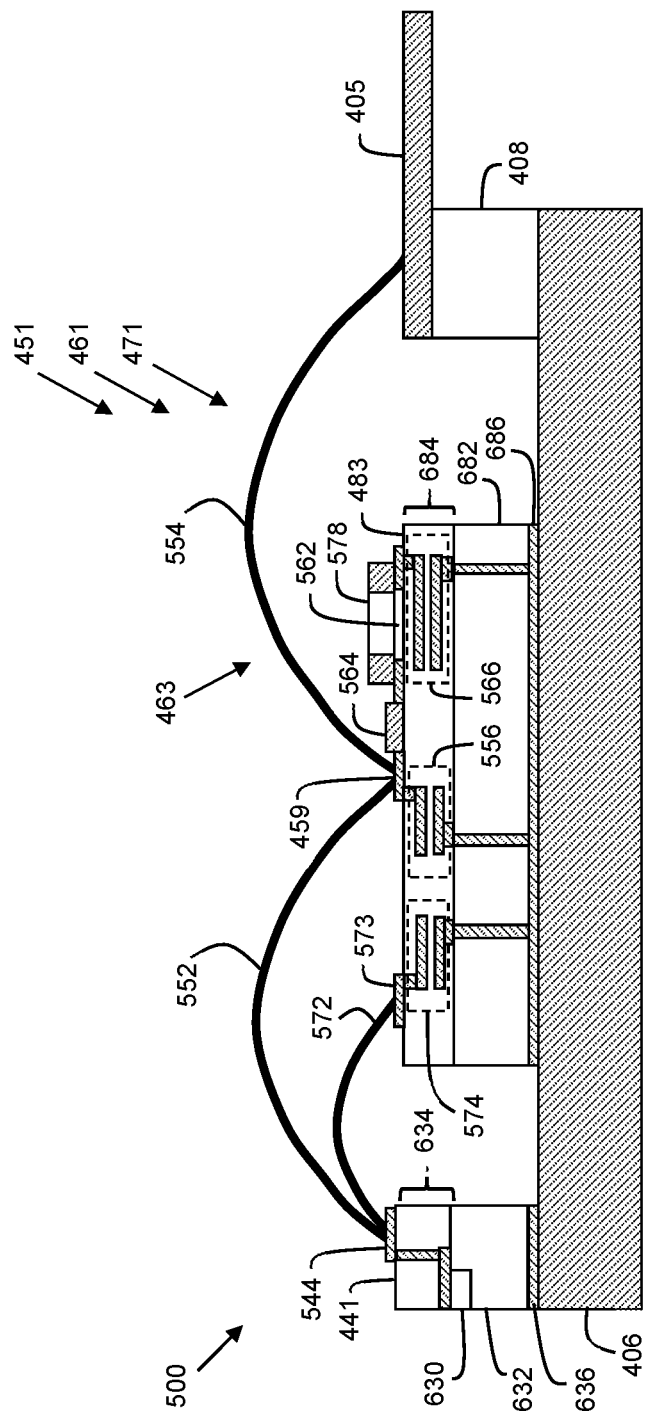
FIG. 6 is a cross-sectional, side view of the portion of the RF power amplifier device of FIG. 5 along line 6-6, in accordance with an example embodiment.

Reference is now made to FIGS. 5 and 6, which include enlarged views of a portion 500 of device 400 that includes embodiments of an output T-match impedance matching circuit 451 (e.g., circuit 150, FIG. 1), baseband termination circuit 463 (e.g., baseband termination circuit 161, FIG. 1), and harmonic termination circuit 471 (e.g., harmonic termination circuit 170, FIG. 1). More specifically, FIG. 5 is a top view of the upper-right, output-side portion 500 of the packaged RF power amplifier device 400 of FIG. 4 along amplifier path 421. As shown most clearly in FIG. 5, portion 500 includes a portion of power transistor die 441, a portion of output lead 405, and output-side IPD assembly 483. For enhanced understanding, FIG. 6 includes a cross-sectional, side view of the portion 500 of the RF power amplifier device of FIG. 5 along line 6-6, in accordance with an example embodiment. It should be understood that, although portion 500 of device 400 depicts details of the output circuitry of amplifier path 421 in detail in FIGS. 5 and 6, the output circuitry of amplifier path 420 may be substantially the same as the output circuitry along amplifier path 421. More specifically, the output circuitry for both the carrier and peaking amplifier paths may be implemented as shown in FIGS. 5 and 6, and as described in detail below.

As is most clearly illustrated in FIG. 6, the power transistor die 441 and the IPD assembly 483 are coupled to the top surface of the conductive flange 406, and the output lead 405 is electrically isolated from the conductive flange 406 (e.g., using isolation structure 408). Power transistor die 441 includes a transistor output terminal 544 (e.g., a conductive bond pad), which is electrically connected within power transistor die 441 to a first current-conducting terminal (e.g., a drain terminal) of a single-stage or final-stage FET 630 integrated within the die 441. As discussed previously, each FET 630 may include a III-V field effect transistor (e.g., a HEMT), such as a GaN FET (or another type of III-V transistor, including a GaAs FET, a GaP FET, an InP FET, or an InSb FET). More specifically, each FET 630 may be integrally formed in and on a base semiconductor substrate 632 (e.g., a GaN substrate, a GaN-on-silicon substrate, a GaN-on-silicon carbide substrate, and so on). Conductive connections between the first current-conducting terminal of the FET 630 (e.g., the drain terminal) and the output terminal 544 of the die 441 may be made through the build-up structure 634. A conductive layer 636 on a bottom surface of the die 441 may provide a ground node (e.g., for the source terminal, which may be connected to the conductive layer 636 (and thus to the conductive flange 406) using through substrate vias or doped sinker regions (not shown).

The IPD assembly 483 also may include a base semiconductor substrate 682 (e.g., a silicon substrate, a silicon carbide substrate, a GaN substrate, or another type of semiconductor substrate, which may be referred to as an "IPD substrate" herein) and a build-up structure 684 of alternating dielectric and patterned conductive layers, where portions of the patterned conductive layers are electrically connected using conductive vias. As will be discussed in more detail below, various electrical components of the output impedance matching circuit 451, the in-package baseband termination circuit 461, and the harmonic termination circuit 471 are integrally formed within and/or connected to the IPD assembly 483. These electrical components may be electrically connected to conductive bond pads (e.g., bond pads 459, 573) at the top surface of the IPD assembly 483, and also may be electrically connected to the conductive flange 406 (e.g., to ground) using through substrate vias to a conductive layer 686 on a bottom surface of the IPD assembly 483.

In some embodiments, the output-side IPD assembly 483 more specifically includes a first shunt capacitor 556 (e.g., shunt capacitance 156, FIG. 1) of an output impedance matching circuit (e.g., circuit 150, FIG. 1, 350, 351, FIG. 3, or 450, 451, FIG. 4), a second shunt capacitor 574 (e.g., shunt capacitance 174, FIG. 1) of a harmonic termination circuit (e.g., circuit 170, FIG. 1, 370, 371, FIG. 3, or 470, 471, FIG. 4), and components of an in-package baseband termination circuit (e.g., circuit 161, FIG. 1, one of circuits 200-205, FIGS. 2A-2F, circuit 362, 363, FIG. 3, or 462, 463, FIG. 4). In the embodiments of FIGS. 5, 6, the components of the baseband termination circuit included in IPD assembly 483 more specifically include an envelope resistor 564 (e.g., resistor 264, FIGS. 2A-2F), an envelope inductor 562 (e.g., inductor 262, FIGS. 2A-2F), an envelope capacitor 566 (e.g., capacitor 266, FIGS. 2A-2F), and a bypass capacitor 578 (e.g., bypass capacitor 278, FIG. 2F). Each of these components will be discussed in more detail later.

First, connections between the transistor die 441 and the output lead 405 through the output impedance matching circuit 451 will be described in more detail. More specifically, through the output terminal 544, the first current conducting terminal (e.g., the drain) of a FET 630 within transistor die 441 is electrically coupled to output lead 405 through an instance of an output impedance matching circuit 451. For example, in an embodiment, output impedance matching circuit 451 has a T-match configuration, which includes two inductive elements 552, 554 (e.g., inductive elements 152, 154, FIG. 1) coupled in series, and a shunt capacitor 556 (e.g., shunt capacitance 156, FIG. 1). A first inductive element 552 (e.g., inductive element 152, FIG. 1) may be implemented as a first set of wirebonds that is coupled between the output terminal 544 of die 441 and a conductive bond pad 459 on a top surface of the IPD assembly 483. A second inductive element 554 (e.g., inductive element 154, FIG. 1) may be implemented as a second set of wirebonds that is coupled between the conductive bond pad 459 and output lead 405. To avoid cluttering FIG. 5, only one wirebond in the set of wirebonds comprising inductive element 552 is circled and numbered with reference number 552. It should be understood that inductive element 552 includes all wirebonds coupled between the output terminal 544 and bond pad 459. According to an embodiment, wirebond arrays 552, 554 each may have an inductance value in a range between about 20 pH to about 3 nH, although their inductance values may be lower or higher, as well.

According to an embodiment, the shunt capacitor 556 of output impedance matching circuit 451 may be implemented as a capacitor (or a set of parallel-coupled capacitors) that is integrally formed with the IPD substrate of IPD assembly 483. For example, shunt capacitor 556 may be implemented as one or more integrated MIM capacitors, which include first and second conductive electrodes (formed from patterned portions of the conductive layers of build-up structure 684) that are aligned with each other and electrically separated by dielectric material of the build-up structure 684. A first electrode (or terminal) of each shunt capacitor 556 is electrically coupled to the conductive bond pad 459 (and thus to wirebonds 552 and 554), and a second electrode (or terminal) of each shunt capacitor 556 is electrically coupled to the conductive flange (e.g., using conductive through substrate vias that extend through the semiconductor substrate 682), in an embodiment. In a more specific embodiment, the first electrode of the shunt capacitor 556 is "directly connected" to the bond pad 459, where "directly connected" means electrically connected, possibly with one or more conductive traces and/or conductive vias, but without intervening circuit elements (i.e., circuit elements that have more than a trace inductance, where a "trace inductance" is an inductance less than about 100 pH). Because the shunt capacitor 556 and the bond pad 459 are "directly connected," and the bond pad 459 also has only a trace inductance, in an embodiment, the wirebonds 552, 554 and the shunt capacitor 556 also may be considered to be "directly connected." In an alternate embodiment, the shunt capacitor 556 may be implemented using a discrete capacitor coupled to a top surface of the IPD assembly 483, or using another type of capacitor. According to an embodiment, shunt capacitor 556 may have a capacitance value in a range between about 10 pF to about 140 pF, although the capacitance value may be lower or higher, as well.

As discussed previously in conjunction with FIG. 1, the T-match configuration formed by inductors 552, 554 and shunt capacitor 556 may function as a low-pass matching stage. Further, the conductive bond pad 459 to which wirebonds 552 and 554 are coupled may correspond to an RF low-impedance point node, or a "quasi RF cold point node" (e.g., node 158, FIG. 1), in an embodiment. According to an embodiment, both an in-package and an out-of-package baseband termination circuit 463, 465 are electrically coupled to conductive bond pad 459 (i.e., to the quasi RF cold point node).

The in-package baseband termination circuit 463 is included in IPD assembly 483, in an embodiment. Baseband termination circuit 463 may have any one of a number of configurations, in various embodiments, such as but not limited to one of the configurations illustrated in FIGS. 2A-2F. In the embodiment illustrated in FIGS. 4-6, which corresponds to the baseband termination circuit 205 of FIG. 2F, the baseband termination circuit 463 includes a series combination of an envelope resistor 564 (e.g., resistor 264, FIG. 2F), an envelope inductance 562 (e.g., inductor 262, FIG. 2F), and an envelope capacitor 566 (e.g., capacitor 266, FIG. 2F) electrically connected between node 459 (e.g., node 158, 218, FIGS. 1, 2F, which may correspond to an RF low-impedance point) and a ground reference (e.g., flange 406). In addition, the baseband termination circuit 463 includes a bypass capacitor 578 (e.g., bypass capacitor 278, FIG. 2F) connected in parallel with envelope inductance 562. In the embodiments of FIGS. 4-6, two instances of the parallel combination of envelope inductance 562 and bypass capacitor 578 are implemented on opposite sides of the IPD assembly 483. More specifically, the parallel combinations of envelope inductance 562 and capacitor 578 are connected in parallel between envelope resistor 564 and envelope capacitor 566, in the illustrated embodiment. In an alternate embodiment, the baseband termination circuit 463 may include only one instance of the combination of envelope inductance 562 and capacitor 578, or more than two instances of the combination of envelope inductance 562 and capacitor 578.

In the embodiments of FIGS. 4-6, envelope resistor 564 is integrally formed as part of the IPD assembly 483. For example, each envelope resistor 564 may be a polysilicon resistor formed from a layer of polysilicon on or within build-up structure 684, and electrically coupled between node 459 and the parallel combination(s) of envelope inductance 562 and bypass capacitor 578. In other alternate embodiments, the envelope resistor 564 may be formed from tungsten silicide or another material, may be a thick or thin film resistor, or may be a discrete component coupled to a top surface of IPD assembly 483.

The envelope inductance 562 also may be integrally formed as part of the IPD assembly 483, as is illustrated in the embodiment of FIGS. 5, 6. For example, each envelope inductance 562 may be provided by a patterned conductor formed from portion(s) of one or more conductive layers of the build-up structure 684, where a first end of the conductor is electrically coupled to envelope resistor 564, and a second end of the conductor is electrically coupled to a first terminal of envelope capacitor 566. In alternate embodiments, each envelope inductance 562 may be implemented as a plurality of wirebonds, or as a spiral inductor (e.g., on or proximate to the top surface of IPD assembly 483), or as a discrete inductor coupled to a top surface of IPD assembly 483.

A bypass capacitor 578 is coupled in parallel with each envelope inductance 562, in an embodiment. Each of the bypass capacitors 578 may be, for example, a discrete capacitor that is connected (e.g., using solder, a conductive epoxy, or other means) to a top surface of IPD assembly 483. More specifically, a first terminal of each bypass capacitor 578 may be electrically coupled to the envelope resistor 564 and to a first terminal of an envelope inductance 562, and a second terminal of each bypass capacitor 578 may be connected to a second terminal of the envelope inductance 562 and to a first terminal of envelope capacitor 566.

For example, each bypass capacitor 578 may be a multiple-layer capacitor (e.g., a multiple-layer ceramic capacitor) with parallel, interleaved electrodes and wrap-around end terminations. Alternatively, each bypass capacitor 578 may form a portion of a separate IPD (e.g., a MIM capacitor formed on a semiconductor substrate), or may be a capacitor that is integrally formed with the semiconductor substrate of the IPD assembly 483. Alternatively, each bypass capacitor 578 may be implemented as some other type of capacitor capable of providing the desired capacitance for the baseband termination circuit 463.

The envelope capacitor 566 is electrically coupled between a ground reference node (e.g., conductive layer 686 at the bottom surface of each IPD assembly 483) and the parallel combination of envelope inductance 562 and bypass capacitor 578. Capacitor 566 may be a MIM capacitor that is integrally formed with the IPD substrate of IPD assembly 483, for example. In some embodiments, capacitor 566 may be formed in the build-up structure 684 entirely above the semiconductor substrate 682, or capacitor 566 may have portions that extend into the semiconductor substrate 682 or are otherwise coupled to, or in contact with, the semiconductor substrate 682. According to an embodiment, the capacitor 566 may be formed from a first electrode, a second electrode, and a dielectric material between the first and second electrodes. The dielectric material of capacitor 566 may include one or more layers of polysilicon, various oxides, a nitride, or other suitable materials. In various embodiments, the first and second electrodes of capacitor 566 may include horizontal portions of conductive layers (e.g., portions that are parallel to the top and bottom surfaces of IPD assembly 483) and/or vertical portions (e.g., portions that are parallel to the sides of IPD assembly 483) of conductive layers that are interconnected. Further, the first and second electrodes of capacitor 566 may be formed from metal layers and/or from conductive semiconductor materials (e.g., poly silicon). Alternatively, each envelope capacitor 566 may be, for example, a discrete capacitor that is connected (e.g., using solder, a conductive epoxy, or other means) to a top surface of the IPD assembly 483. Although particular two-plate capacitor structures are shown in FIG. 6 for capacitors 556, 574, and 566, a variety of other capacitor structures alternatively may be utilized, as would be understood by one of skill in the art based on the description herein.

The out-of-package baseband termination circuit 465 includes a combination of an envelope inductance and an envelope capacitance coupled in series between the conductive bond pad 458 (i.e., the quasi RF cold point node) and ground. The envelope inductance is provided by the series combination of wirebonds 590 (FIG. 5) and additional lead 495 (FIG. 4), and the envelope capacitance is provided by discrete capacitor 499 (FIG. 4). More specifically, the first ends of wirebonds 590 may be connected to the conductive bond pad 459, and the second ends of wirebonds 590 may be connected to a proximal end of the additional lead 495. A first terminal of the envelope capacitor 499 is coupled to a distal end of the additional lead 495, and a second terminal of the capacitor 499 is coupled to a ground reference point for a PCB to which the amplifier device 400 is coupled.

As discussed previously, a harmonic termination circuit 471 also is connected between the first current conducting terminal (e.g., the drain) of FET 630 within transistor die 441 and a ground reference (e.g., to the conductive layer 686 on the bottom surface of IPD assembly 483). In the embodiment of FIGS. 5 and 6, the harmonic termination circuit 471 includes a series combination of a shunt inductive element 572 (e.g., shunt inductive element 172, FIG. 1) and a shunt capacitor 574 (e.g., shunt capacitance 174, FIG. 1). The shunt inductive element 572 may be implemented as a set of wirebonds, where first ends of the wirebonds are connected to the output terminal 544 of die 441 (and thus to the first current conducting terminal of the FET 630), and second ends of the wirebonds are connected to a conductive bond pad 573 that is exposed at a top surface of IPD assembly 483. To avoid cluttering FIG. 5, only two wirebonds in the set of wirebonds comprising inductive element 572 are circled and numbered with reference number 572. It should be understood that inductive element 572 includes all wirebonds coupled between the output terminal 544 and bond pad 573. Within IPD assembly 483, the bond pad 573 is electrically connected to a first terminal of shunt capacitor 574, and a second terminal of shunt capacitor 574 is electrically connected (e.g., using through substrate vias) to the ground reference (e.g., to the conductive layer 686 on the bottom surface of IPD assembly 483).

According to an embodiment, the shunt capacitor 574 of harmonic termination circuit 471 may be implemented as a capacitor that is integrally formed with the IPD substrate of the IPD assembly 483. For example, shunt capacitor 574 may be implemented as an integrated MIM capacitor, which includes first and second conductive electrodes (formed from patterned portions of the conductive layers of build-up structure 684) that are aligned with each other and electrically separated by dielectric material of the build-up structure 684. A first electrode (or terminal) of the shunt capacitor 574 is electrically coupled to the conductive bond pad 573, and a second electrode (or terminal) of the shunt capacitor 574 is electrically coupled to the conductive flange (e.g., using through substrate vias), in an embodiment. In a more specific embodiment, the first electrode of the shunt capacitor 574 is "directly connected" (as defined previously) to the bond pad 573. Because the shunt capacitor 574 and the bond pad 573 are "directly connected," and the bond pad 573 also has only a trace inductance, in an embodiment, the wirebonds 572 and the shunt capacitor 574 also may be considered to be "directly connected." In an alternate embodiment, the shunt capacitor 574 may be implemented using a discrete capacitor coupled to a top surface of the IPD assembly 483, or using another type of capacitor.

According to an embodiment, the harmonic termination circuit 471 functions as low impedance path to ground for signal energy at a harmonic frequency (e.g., a second harmonic of a fundamental frequency of operation of device 400). More specifically, the component values for the shunt inductance 572 and the shunt capacitance 574 are selected so that the series combination of the shunt inductance 572 and shunt capacitance 574 resonate at or near the second harmonic frequency. For example, the fundamental frequency of operation of device 400 may be in a range of about 800 megahertz (MHz) to about 6.0 gigahertz (GHz), and thus the second harmonic frequency (and resonant frequency of circuit 471) may be in a range of about 1.6 GHz to about 12.0 GHz. According to an embodiment, inductance 572 may have an inductance value in a range between about 20 pH to about 3 nH, and capacitor 574 may have a capacitance value in a range between about 1 pF to about 100 pF, although these components may have values outside of these ranges, as well. As discussed above in conjunction with FIG. 1, for example, at a fundamental frequency of operation of 2.0 GHz, which has a second harmonic at 4.0 GHz, inductive element 572 may have an inductance value of about 120-140 pH, and capacitor 574 may have a capacitance value of about 11-12 pF. However, the designed inductance and/or capacitance values may be affected by mutual coupling between wirebonds used to implement inductive elements 552 and 572.

More specifically, and according to an embodiment, the wirebonds corresponding to inductive elements 552 and 572 are physically configured and arranged, with respect to each other, to exhibit a predictable mutual coupling between these adjacent sets of wirebonds during operation. More specifically, the wirebond profiles (e.g., the heights and shapes of each set of wirebonds 552 and 572) and their proximities to other wirebonds result in predictable mutual coupling, during operation, that results in different effective inductance values of the inductive elements 552 and 572, during operation, than the self-inductance values of the inductive elements 552 and 572 when each inductance is taken in isolation (i.e., not affected by mutual inductance from other inductances). For example, at a center frequency of operation of 2.0 GHz, the mutual coupling between inductive elements 552 and 572 may be in a range of about 1 pH to about 150 pH (e.g., about 69 pH).

According to an embodiment, the inductance provided between the transistor output and the shunt capacitor within the output impedance matching circuit may be significantly reduced, when compared with a conventional device, with the inclusion of an embodiment of a harmonic termination circuit 471. More specifically, during operation of device 400, harmonic termination circuit 471 is essentially equivalent to a capacitor at a fundamental frequency of operation of the device 400, with the capacitance value being approximately equivalent to the effective capacitance of series-coupled inductor/capacitor 572/574. Because this shunt capacitance is coupled in parallel with the drain-source capacitance between the transistor output and the ground reference, the equivalent shunt capacitance from the combination of inductor/capacitor 572/574 effectively increases the drain-source capacitance of the FET 630 within the transistor die 441. In some embodiments, the shunt capacitance 574 has a capacitance value that effectively increases the drain-source capacitance of the FET 630 to which it is connected by at least 10 percent. As a result of this effective increase in the drain-source capacitance, the inductance between the transistor output and the shunt capacitor within the output impedance matching circuit (e.g., capacitor 556 within circuit 451) may be decreased, when compared with conventional circuits. Accordingly, whereas a conventional circuit may require an additional inductor to provide an inductance that is greater than the inductance provided by the wirebonds connected between the transistor die and the shunt capacitor within the output impedance matching circuit, no such additional inductance is included in circuit 451. Instead, in circuit 451, wirebonds 552 may be directly connected (as defined previously) to shunt capacitance 556.

FIGS. 4-6 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

FIG. 7 is a flowchart of a method for fabricating a packaged RF power amplifier device (e.g., device 400, FIG. 4) that includes embodiments of input and output impedance matching circuits, baseband termination circuits, and harmonic termination circuit (e.g., circuits 200-205, 410, 411, 430, 431, 450, 451, 460-463, 470, 471, FIGS. 2A-2F, 4), in accordance with various example embodiments. The method may begin, in blocks 702-704, by forming one or more IPD assemblies. More specifically, in block 702, one or more input and output IPDs (e.g., IPDs 480-483, FIGS. 4-6) may be formed. According to an embodiment, each input IPD (e.g., IPDs 480, 481) may include components of an impedance matching circuit, a baseband termination circuit, and a harmonic termination circuit. According to an embodiment, each output IPD (e.g., IPDs 482, 483) also may include components of an impedance matching circuit, a baseband termination circuit, and a harmonic termination circuit. For example, each output IPD may include one or more integrated shunt capacitors (e.g., capacitors 556, 566, 574, FIGS. 5, 6), one or more envelope inductive elements (e.g., inductive elements 562, FIGS. 5, 6), and one or more envelope resistors (e.g., resistors 564, FIGS. 5, 6). In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes (e.g., nodes 459, 573, FIGS. 4-6) at a surface of each IPD substrate. As discussed previously, the connection nodes may include conductive bond pads, which may accept attachment of inductive elements (e.g., wirebonds 552, 554, 572, FIGS. 5, 6). In addition, in block 704, discrete components corresponding to various circuit elements (e.g., bypass capacitors 578, FIGS. 5, 6) may be coupled to conductors exposed at the surface of each IPD to form one or more IPD assemblies.

In block 706, for an air cavity embodiment, an isolation structure (e.g., isolation structure 408, FIG. 4) is coupled to a device substrate (e.g., flange 406). In addition, one or more active devices (e.g., transistors 440, 441) and IPD assemblies (e.g., IPD assemblies 480-483) are coupled to a portion of the top surface of the substrate that is exposed through an opening in the isolation structure. Leads (e.g., input and output leads 402-405, and additional leads 492-495, if included) are coupled to the top surface of the isolation structure. For overmolded (e.g., encapsulated) device embodiments, the isolation structure may be excluded, and the substrate and leads may form portions of a leadframe.

In block 708, the input lead(s), transistor(s), IPD assembly(ies), and output lead(s) are electrically coupled together. For example, the electrical connections may be made using wirebonds between the various device components and elements, as discussed previously. Some of the wirebonds correspond to inductive components of input or output matching circuits (e.g., wirebonds 552, 554, FIGS. 4-6), and harmonic termination circuits (e.g., wirebonds 572, FIGS. 4-6), for example. Finally, in block 710, the device is capped (e.g., for an air cavity package) or encapsulated (e.g., with mold compound for an overmolded package). The device may then be incorporated into a larger electrical system (e.g., a Doherty amplifier or other type of electrical system).

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier with a first amplification path that comprises:
    a transistor die with a transistor and a transistor output terminal;
    an output-side impedance matching circuit having a T-match circuit topology coupled between the transistor output terminal and an output of the first amplification path, wherein the output-side impedance matching circuit includes
        a first inductive element connected between the transistor output terminal and a quasi RF cold point node,
        a second inductive element connected between the quasi RF cold point node and the output of the first amplification path, and
        a first capacitance connected between the quasi RF cold point node and a ground reference node; and
    a baseband termination circuit directly connected to the quasi RF cold point node, wherein the baseband termination circuit includes a plurality of components, wherein the plurality of components includes an envelope resistor, an envelope inductor, and an envelope capacitor coupled in series between the quasi RF cold point node and the ground reference node.

2. The RF amplifier of claim 1, wherein:
    the first inductive element includes a first plurality of wirebonds; and
    the second inductive element includes a second plurality of wirebonds.

3. The RF amplifier of claim 1, further comprising:
    an output-side harmonic termination circuit comprising a third inductive element and a second capacitance connected in series between the transistor output terminal and the ground reference node, and the output-side harmonic termination circuit resonates at a second harmonic frequency of a fundamental frequency of operation of the RF amplifier.

4. The RF amplifier of claim 1, wherein the transistor is a gallium nitride transistor with a drain-source capacitance below 0.2 picofarads per watt.

5. The RF amplifier of claim 1, wherein the RF amplifier is a Doherty power amplifier further comprising:
    a second amplification path;
    a power divider with a power divider input configured to receive an RF signal, a first power divider output coupled to an input of the first amplification path, and a second power divider output coupled to an input of the second amplification path, wherein the power divider is configured to divide the RF signal into a first RF signal that is provided to the first amplification path through the first power divider output, and into a second RF signal that is provided to the second amplification path through the second power divider output; and
    a combining node configured to receive and combine amplified RF signals produced by the first and second amplification paths.

6. A packaged radio frequency (RF) amplifier device comprising:
    a device substrate;
    a first input lead coupled to the device substrate;
    a first output lead coupled to the device substrate;
    a first transistor die coupled to the device substrate, wherein the first transistor die includes a first transistor, a transistor input terminal coupled to the first input lead, and a transistor output terminal coupled to the first output lead, and wherein the first transistor has a drain-source capacitance below 0.2 picofarads per watt;
    a first output-side impedance matching circuit having a T-match circuit topology coupled between the first transistor output terminal and the first output lead, wherein the first output-side impedance matching circuit includes
        a first inductive element connected between the transistor output terminal and a first quasi RF cold point node, wherein the first inductive element includes a first plurality of wirebonds,
        a second inductive element connected between the first quasi RF cold point node and the first output lead, wherein the second inductive element includes a second plurality of wirebonds, and
        a first capacitance connected between the first quasi RF cold point node and a ground reference node; and
    a first baseband termination circuit directly connected to the first quasi RF cold point node, wherein the first baseband termination circuit includes a first plurality of components, wherein the first plurality of components includes a first envelope resistor, a first envelope inductor, and a first envelope capacitor coupled in series between the first quasi RF cold point node and the ground reference node.

7. The packaged RF amplifier device of claim 6, wherein the transistor is a gallium nitride transistor.

8. The packaged RF amplifier device of claim 6, further comprising:
an integrated passive device coupled to the device substrate between the first transistor die and the first output lead, wherein the integrated passive device includes the first quasi RF cold point node, the first capacitance, the envelope resistor, the envelope inductor, and the envelope capacitor.

9. The packaged RF amplifier device of claim 8, further comprising:
an output-side harmonic termination circuit comprising a third inductive element and a second capacitance connected in series between the transistor output terminal and the ground reference node, wherein the third inductive element includes a third plurality of wirebonds, and the output-side harmonic termination circuit resonates at a second harmonic frequency of a fundamental frequency of operation of the RF amplifier.

10. The packaged RF amplifier device of claim 9, wherein the second capacitance is integrally formed with the integrated passive device.

11. The packaged RF amplifier device of claim 8, further comprising:
a second baseband termination circuit connected to the first quasi RF cold point node, wherein the second baseband termination circuit includes a second plurality of components, wherein the second plurality of components includes a second envelope inductor and a second envelope capacitor coupled in series between the first quasi RF cold point node and the ground reference node.

12. The packaged RF amplifier device of claim 11, wherein:
the second envelope inductor includes an additional lead with a proximal end electrically coupled to the first quasi RF cold point node, and a distal end exterior to the packaged RF amplifier device; and
the second envelope capacitor includes a discrete capacitor with a first terminal coupled to the distal end of the additional lead, and a second terminal coupled to ground.

13. The packaged RF amplifier device of claim 6, further comprising:
a second input lead coupled to the device substrate;
a second output lead coupled to the device substrate;
a second transistor die coupled to the device substrate, wherein the second transistor die includes a second transistor coupled between the second input lead and the second output lead;
a second output-side impedance matching circuit having the T-match circuit topology coupled between the second transistor and the second output lead, and further having a second quasi RF cold point node; and
a second baseband termination circuit connected to the second quasi RF cold point node.

14. A method of manufacturing an RF amplifier device, the method comprising the steps of:
coupling an input lead to a device substrate;
coupling an output lead to the device substrate;
coupling a transistor die to the device substrate between the input and output leads, wherein the transistor die includes a transistor and a transistor output terminal, and wherein the transistor has a drain-source capacitance below 0.2 picofarads per watt;

coupling an integrated passive device to the device substrate between the transistor die and the input lead, wherein the integrated passive device includes a quasi RF cold point node, a ground reference node, a first capacitor coupled between the quasi RF cold point node and the ground node, and a baseband termination circuit directly connected to the quasi RF cold point node, wherein the baseband termination circuit includes an envelope resistor, an envelope capacitor, and an envelope inductor coupled in series between the quasi RF cold point node and the ground reference node; and
creating an output-side impedance matching circuit with a T-match circuit topology between the transistor output terminal and the output lead, wherein the T-match circuit topology includes the first capacitor, and the output-side impedance matching circuit is created by coupling a first inductive element between the transistor output terminal and the quasi RF cold point node, wherein the first inductive element includes a first plurality of wirebonds, and coupling a second inductive element between the quasi RF cold point node and the output lead, wherein the second inductive element includes a second plurality of wirebonds.

15. The method of claim 14, wherein:
the integrated passive device further comprises
an additional node, and
a second capacitance coupled between the additional node and the ground reference node; and
the method further includes
creating an output-side harmonic termination circuit by coupling a third inductive element between the transistor output terminal and the additional node, wherein the third inductive element includes a third plurality of wirebonds, and the output-side harmonic termination circuit resonates at a second harmonic frequency of a fundamental frequency of operation of the RF amplifier device.

16. The RF amplifier of claim 1, wherein the baseband termination circuit further includes a bypass capacitor coupled in parallel across one or more of the plurality of components of the first baseband termination circuit.

17. The RF amplifier of claim 16, wherein the bypass capacitor is coupled in parallel across the envelope inductor, and wherein the envelope inductor and the bypass capacitor form a parallel resonant circuit in proximity to a center operating frequency of the RF amplifier.

18. The RF amplifier of claim 3, wherein:
the third inductive element has an inductance value in a range of 20 picohenries to 3 nanohenries; and
the second capacitance has a capacitance value in a range of 1 picofarad to 100 picofarads.

19. The RF amplifier of claim 1, wherein:
the first inductive element has an inductance value in a range of 20 picohenries to 3 nanohenries;
the second inductive element has an inductance value in a range of 20 picohenries to 3 nanohenries; and
the first capacitance has a capacitance value in a range of 10 picofarad to 140 picofarads.

20. The RF amplifier of claim 1, wherein:
the envelope resistor has a resistance value in a range of 0.1 ohms to 5.0 ohms;
the envelope inductor has an inductance value in a range of 5 picohenries to 3000 picohenries; and the envelope capacitor has a capacitance value in a range of 1 nanofarad to 1 microfarad.

* * * * *